(12) United States Patent
Sakata

(10) Patent No.: US 7,064,603 B2
(45) Date of Patent: Jun. 20, 2006

(54) DRIVING CIRCUIT AND SEMICONDUCTOR DEVICE

(75) Inventor: Hiroshi Sakata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 67 days.

(21) Appl. No.: 10/855,379

(22) Filed: May 28, 2004

(65) Prior Publication Data

US 2005/0088227 A1 Apr. 28, 2005

(30) Foreign Application Priority Data

Oct. 27, 2003 (JP) ............................. 2003-365868

(51) Int. Cl.
*H03F 3/38* (2006.01)
(52) U.S. Cl. ..................... 330/10; 330/207 A
(58) Field of Classification Search .................. 330/10, 330/207 A, 251
See application file for complete search history.

(56) References Cited

U.S. PATENT DOCUMENTS 5,351,182 A   9/1994  Miyazaki et al. ............ 363/132

6,469,575 B1 * 10/2002 Oki et al. ...................... 330/10
6,788,137 B1 *  9/2004 Morita ......................... 330/10
6,812,785 B1 * 11/2004 Masuda et al. ............... 330/10
6,831,508 B1 * 12/2004 Shima .......................... 330/10

FOREIGN PATENT DOCUMENTS

| JP | 6-153533    | 5/1994 |
| JP | 11-103570   | 4/1999 |
| JP | 2003-101391 | 4/2003 |

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

A pulse generation part outputs a first ON pulse signal for turning a switching device on to a control part on based on the leading edge of a signal from the outside of a semiconductor device. The pulse generation part subsequently outputs a second ON pulse signal for turning the switching device on to the control part based on the same leading edge of the signal as the first ON pulse signal after a lapse of prescribed time after outputting the first ON pulse signal. Even if the control part cannot output an ON signal to the switching device based on the first ON pulse signal, the control part can output an ON signal based on the second ON pulse signal.

14 Claims, 14 Drawing Sheets

F I G. 5
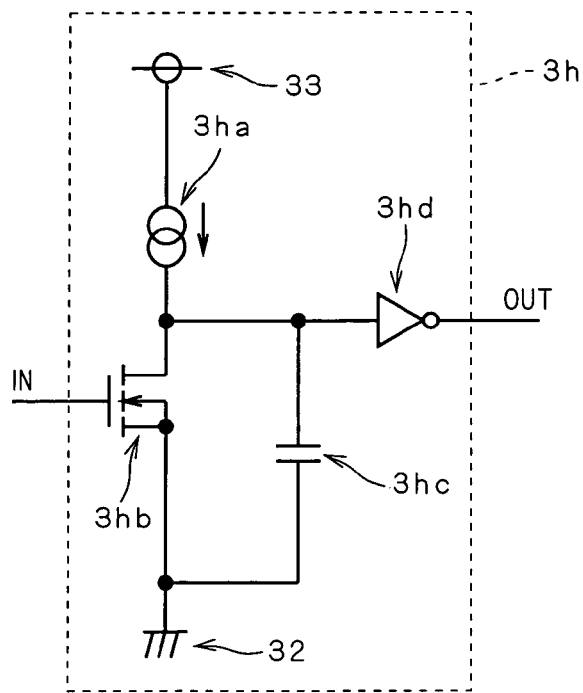
F I G. 6
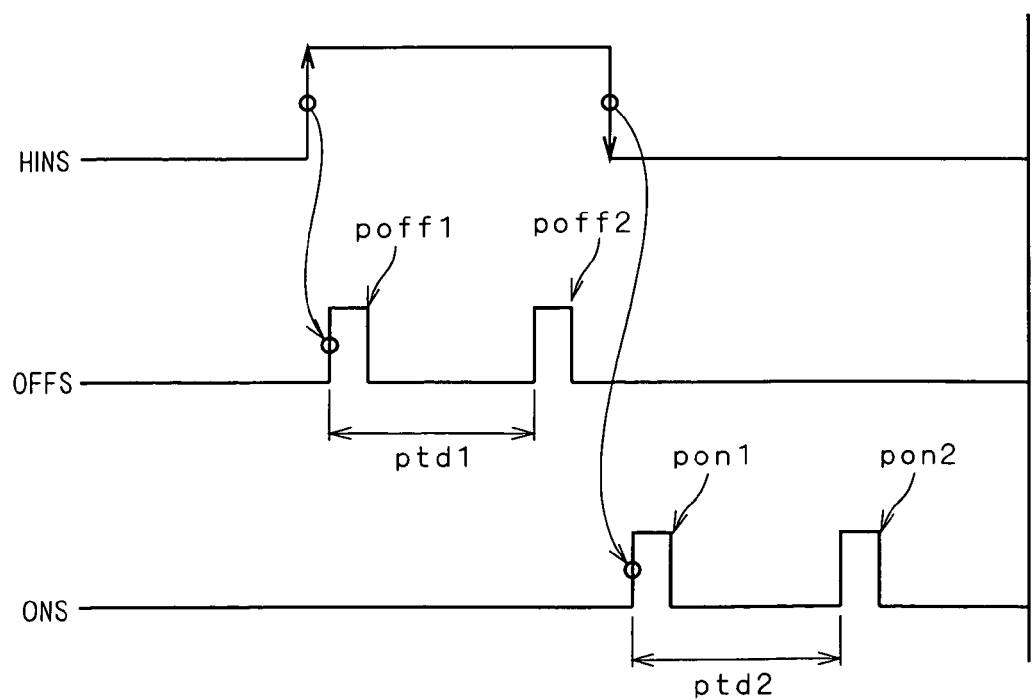

DRIVING CIRCUIT AND SEMICONDUCTOR DEVICE

BACKGROUND OF THE INVENTION

1. Field of the Invention

This invention relates to driving circuits for switching devices such as IGBTs (Insulated Gate Bipolar Transistor) and semiconductor devices including the driving circuits.

2. Description of the Background Art

Conventional driving circuits for switching devices such as IGBTs generate pulse signals for turning the switching devices on and off based on edges of external input signals, and generate ON signals and OFF signals for controlling the switching devices based on those pulse signals level-shifted by level shift circuits. The driving circuits then supply the ON signals and OFF signals to the switching devices to bring them into a conducting state and non-conducting state, respectively, thereby switching the switching devices on and off. Other driving circuits for switching devices are disclosed in Japanese Patent Application Laid-Open Nos. 6-153533 (1994), 2003-101391 and 11-103570 (1999).

When the above conventional driving circuits are used to drive and cause a high-potential side switching device to transition from OFF to ON between two switching devices that are totem-pole-connected between a high potential and a low potential, the ON signals may not be generated depending on the transition timing. In short, the high-potential side switching device sometimes cannot be turned on despite the wish to do so. This problem will be described in detail.

When the high-potential side switching device makes an ON to OFF transition between the two totem-pole-connected switching devices as described above, a potential at a node between the two switching devices falls from a high level to become a negative potential. At this time, the node potential becomes less than a certain negative potential, whereby the output level of the level shift circuits is sometimes fixed at a low level, for example, for a certain period.

Accordingly, the pulse signals for the turning-on which may be generated based on the external input signals while the node potential is less than the certain negative potential are not accepted, making it impossible for the ON signals to be output. The result is that the high-potential side switching device cannot be turned on reliably based on the edges of the input signals.

SUMMARY OF THE INVENTION

It is an object of this invention to provide a technique capable of turning a switching device on reliably based on an edge of an input signal even when an ON signal cannot be output to the switching device.

According to this invention, a driving circuit for a switching device includes a pulse generation part and a control part. The pulse generation part outputs an ON transmission pulse signal based on one edge of an input signal of the driving circuit, and outputs an OFF transmission pulse signal based on the other edge of the input signal. The control part outputs an ON signal for bringing the switching device into a conducting state based on the ON transmission pulse signal, and outputs an OFF signal for bringing the switching device into a non-conducting state based on the OFF transmission pulse signal. The ON transmission pulse signal includes first and second ON pulse signals. The pulse generation part outputs the first ON pulse signal based on the one edge, and outputs the second ON pulse signal based on the one edge on which the output of the first ON pulse signal is based after a lapse of prescribed time after outputting the first ON pulse signal.

The pulse generation part outputs the second ON pulse signal after a lapse of the prescribed time after outputting the first ON pulse signal. Accordingly, even when the control part does not output an ON signal for a certain period within the prescribed time, the control part can output an ON signal reliably based on the one edge of the input signal. The result is that the switching device can be brought into a conducting state reliably.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram showing the configuration of a delay circuit 3h according to the first preferred embodiment;

FIG. 6 shows the operation of the pulse generation part 3 according to the first preferred embodiment;

DESCRIPTION OF THE PREFERRED EMBODIMENTS

First Preferred Embodiment

Figure 1:
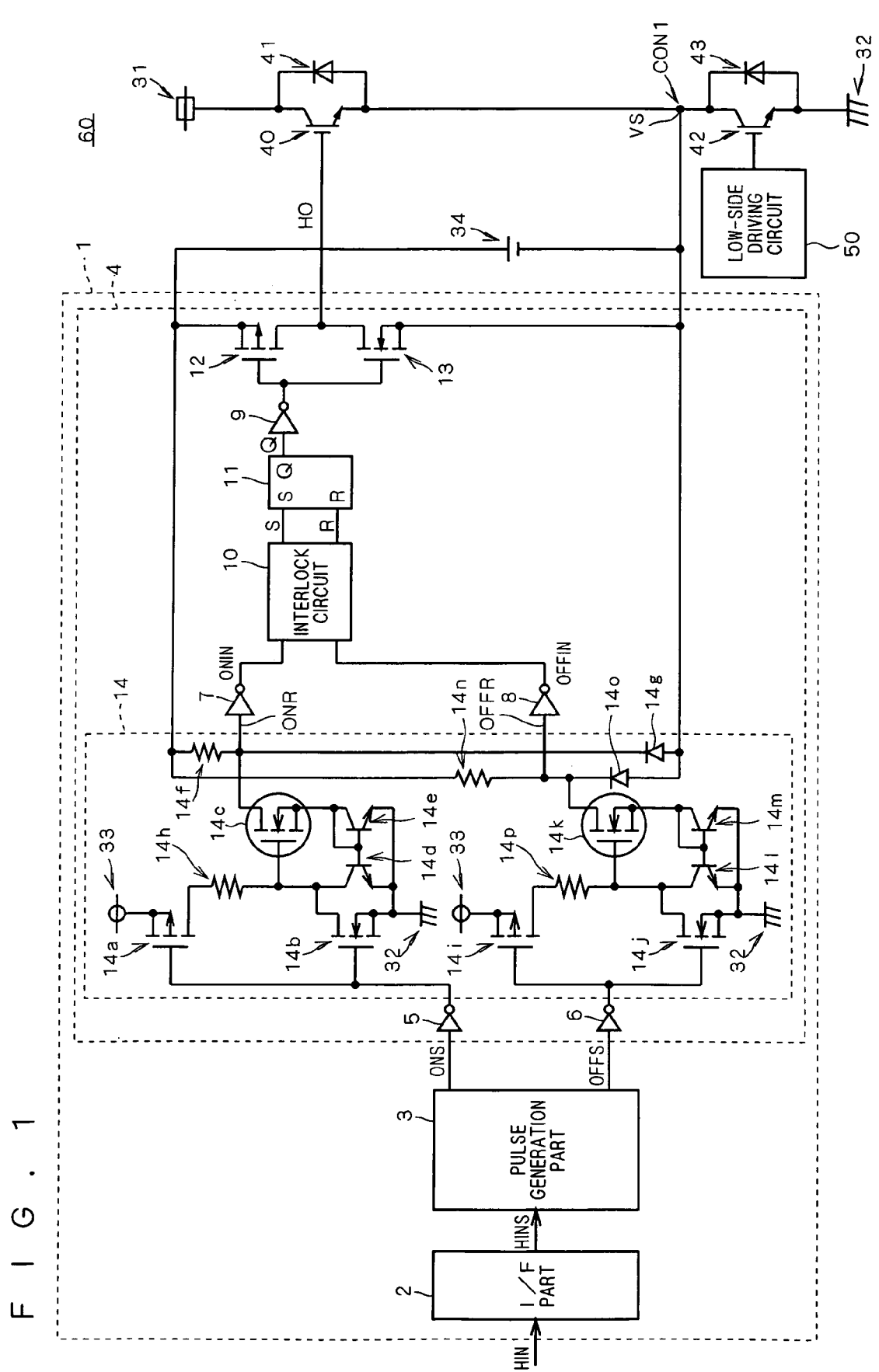
FIG. 1 is a block diagram showing the configuration of a semiconductor device 60 according to a first preferred embodiment of the invention.

FIG. 1 is a block diagram showing the configuration of a semiconductor device 60 according to preferred embodiments of this invention. As shown in FIG. 1, the semiconductor device 60 according to the preferred embodiments includes switching devices 40 and 42 both of which are IGBTs, for example, freewheel diodes 41 and 43, a driving circuit 1 for the switching device 40, a driving circuit 50 for the switching device 42, and a power source 34.

The switching device 40 has a collector connected to a high power supply potential 31 and the cathode of the freewheel diode 41, and an emitter connected to the anode of the freewheel diode 41. The switching device 42 has an emitter connected to a low power supply potential 32 and the anode of the freewheel diode 43, and a collector connected to the cathode of the freewheel diode 43. The emitter of the switching device 40 and the collector of the switching device 42 are connected to each other at a node CON1. A load not shown such as a motor is connected to the node CON1. As such, the switching devices 40 and 42 are totem-pole-connected to each other and inserted between the power supply potentials 31 and 32.

Each of the power supply potentials 31 and 32 is supplied from the outside of the semiconductor device 60. The power supply potential 32 is a ground potential, for example, and the value of the power supply potential 31 with reference to the value of the power supply potential 32 indicates 600V, for example. The power supply potential 32 is hereinafter called a "ground potential 32". The driving circuit 50 for the low-potential side switching device 42 is connected to the gate of the switching device 42 and supplies prescribed signals to the gate, thereby turning the switching device 42 on and off. The driving circuit 50 is remotely related to the invention and an explanation thereof is thus omitted.

The driving circuit 1 for the high-potential side switching device 40 includes an I/F part 2, a pulse generation part 3 and a control part 4. The I/F part 2 inverts a signal HIN input from the outside of the semiconductor device 60 and outputs it as a signal HINS to the pulse generation part 3. The pulse generation part 3 outputs an ON transmission pulse signal ONS and an OFF transmission pulse signal OFFS based on the signal HINS to the control part 4.

The control part 4 includes inverters 5 to 9, an interlock circuit 10, an RS flip-flop circuit 11, a pMOS transistor 12, an NMOS transistor 13, and a level shift circuit 14. The inverters 5 and 6 invert and output the ON transmission pulse signal ONS and OFF transmission pulse signal OFFS, respectively. The level shift circuit 14 level-shifts the outputs from the inverters 5 and 6 and outputs them as signals ONR and OFFR, respectively. The inverters 7 and 8 invert the signals ONR and OFFR and output them as signals ONIN and OFFIN, respectively.

The interlock circuit 10 outputs signals S and R based on the signals ONIN and OFFIN, respectively. The signals S and R are input into the set input and reset input of the RS flip-flop circuit 11, respectively. The output from the RS flip-flop circuit 11 is input into the inverter 9 as a signal Q.

The inverter 9 inverts the signal Q and outputs it to the respective gates of the pMOS transistor 12 and nMOS transistor 13. The drain of the pMOS transistor 12 is connected to the drain of the nMOS transistor 13. Then, the drain potential of the pMOS transistor 12, namely the drain potential of the nMOS transistor 13, is supplied to the gate of the switching device 40 as a signal HO.

The power source 34 has a positive potential output connected to the source of the pMOS transistor 12 and the level shift circuit 14, and a negative potential output connected to the source of the nMOS transistor 13, the node CON1, and the level shift circuit 14. The value of the positive potential output of the power source 34 with reference to the value of the negative potential output thereof, namely the value of the positive potential output of the power source 34 with reference to a potential VS at the node CON1, is +15V, for example.

Next, the configuration of the level shift circuit 14 will be described in detail. As shown in FIG. 1, the level shit circuit 14 includes pMOS transistors 14a and 14i, nMOS transistors 14b and 14j, high breakdown voltage nMOS transistors 14c and 14k, resistors 14f, 14h, 14n and 14p, diodes 14g and 14o, and NPN bipolar transistors 14d, 14e, 14l and 14m.

The pMOS transistor 14a has a source connected to a power supply potential 33 and a drain connected to one end of the resistor 14h. The other end of the resistor 14h is connected to the drain of the NMOS transistor 14b, the gate of the high breakdown voltage NMOS transistor 14c, and the collector of the bipolar transistor 14d. The gate of the pMOS transistor 14a is connected to the output of the inverter 5 and the gate of the NMOS transistor 14b.

The source of the nMOS transistor 14b and the emitter of each of the bipolar transistors 14d and 14e are connected to one another, to be connected to the ground potential 32. The base of each of the bipolar transistors 14d and 14e, the collector of the bipolar transistor 14e, and the source of the high breakdown voltage nMOS transistor 14c are connected to one another, while the drain of the high breakdown voltage nMOS transistor 14c is connected to one end of the resistor 14f and the cathode of the diode 14g. The drain potential of the high breakdown voltage nMOS transistor 14c is input into the inverter 7 as the signal ONR.

The pMOS transistor 14i has a source connected to the power supply potential 33 and a drain connected to one end of the resistor 14p. The other end of the resistor 14p is connected to the drain of the nMOS transistor 14j, the gate of the high breakdown voltage nMOS transistor 14k, and the collector of the bipolar transistor 14l. The gate of the pMOS transistor 14i is connected to the output of the inverter 6 and the gate of the nMOS transistor 14j.

The source of the nMOS transistor 14j and the emitter of each of the bipolar transistors 14l and 14m are connected to one another, to be connected to the ground potential 32. The base of each of the bipolar transistors 14l and 14m, the collector of the bipolar transistor 14m, and the source of the high breakdown voltage nMOS transistor 14k are connected to one another, while the drain of the high breakdown voltage nMOS transistor 14k is connected to one end of the resistor 14n and the cathode of the diode 14o. The drain potential of the high breakdown voltage nMOS transistor 14k is input into the inverter 8 as the signal OFFR. The inverters 7 to 9, interlock circuit 10 and RS flip-flop circuit 11 operate with the positive potential output from the power source 34 and the potential VS as a power source.

The anodes of the diodes 14g and 14o are connected to each other, to be connected to the negative potential output of the power source 34. The other ends of the resistors 14f and 14n are connected to each other, to be connected to the positive potential output of the power source 34. The power supply potential 33 is supplied from the outside of the semiconductor device 60, and the value of the power supply potential 33 with reference to the value of the ground potential 32 is +15V, for example. The above I/F part 2 and pulse generation part 3, which are also supplied with the ground potential 32 and power supply potential 33, operate with those potentials as a power source. The above signals HIN, HINS, ON transmission pulse signal ONS, and OFF transmission pulse signal OFFS are signals with the ground potential 32 as the reference, while the signals ONR, OFFR, ONIN, OFFIN, S, R, Q and HO are signals with the potential VS as the reference.

Figure 2:
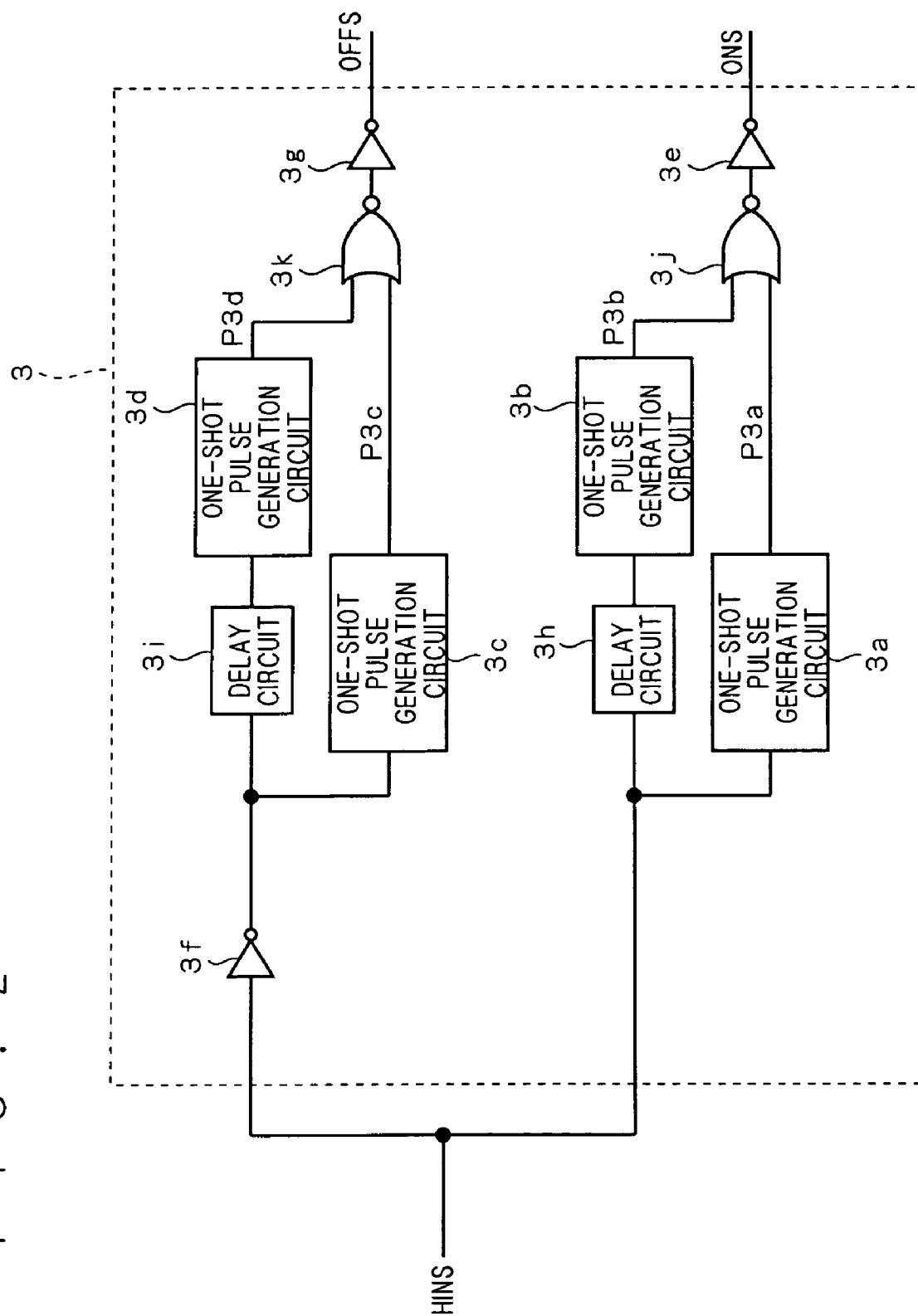
FIG. 2 is a block diagram showing the configuration of a pulse generation part 3 according to the first preferred embodiment.

Next, the inner configuration of the pulse generation part 3 will be described in detail. FIG. 2 is a block diagram showing the configuration of the pulse generation part 3. As shown in FIG. 2, the pulse generation part 3 includes one-shot pulse generation circuits 3a to 3d, inverters 3e to 3g, delay circuits 3h and 3i, and NOR circuits 3j and 3k.

The signal HINS input from the I/F part 2 branches into two signals. One signal HINS is input into the inverter 3f which inverts and outputs the signal HINS. The one-shot pulse generation circuit 3c outputs a signal P3c based on the output from the inverter 3f, while the delay circuit 3i delays the output from the inverter 3f by a prescribed time interval and outputs it. The one-shot pulse generation circuit 3d outputs a signal P3d based on the output from the delay circuit 3i, and the NOR circuit 3k operates and outputs the NOR of the signals P3c and P3d. Then, the inverter 3g inverts the output from the NOR circuit 3k and outputs it as the OFF transmission pulse signal OFFS.

The other signal HINS is input into the one-shot pulse generation circuit 3a and the delay circuit 3h. The one-shot pulse generation circuit 3a outputs a signal P3a based on the signal HINS, while the delay circuit 3h delays the signal HINS by the prescribed time interval and outputs it. The one-shot pulse generation circuit 3b outputs a signal P3b based on the output from the delay circuit 3h, and the NOR circuit 3j operates and outputs the NOR of the signals P3a and P3b. Then, the inverter 3e inverts the output from the NOR circuit 3j and outputs it as the ON transmission pulse signal ONS.

Figure 3:
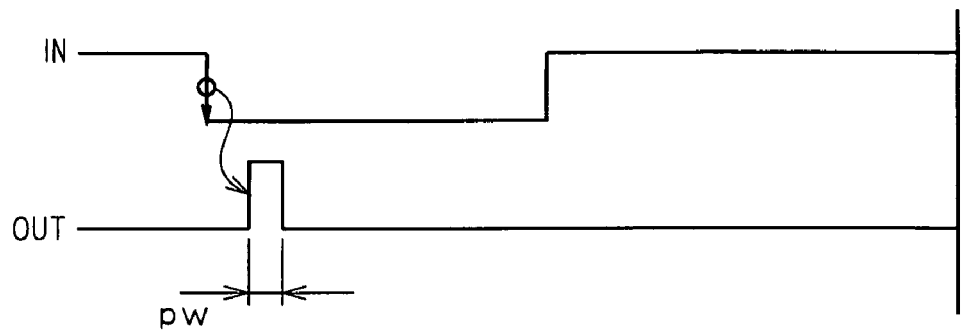
FIG. 3 shows the operation of a one-shot pulse generation circuit 3a according to the first preferred embodiment.

FIG. 3 shows the operation of each of the one-shot pulse generation circuits 3a to 3d. As shown in FIG. 3, the one-shot pulse generation circuit outputs a pulse signal having a prescribed pulse length pw upon high level to low level transition of the input signal. The one-shot pulse generation circuit executes this operation by having a circuit as shown in FIG. 4, for example.

Figure 4:
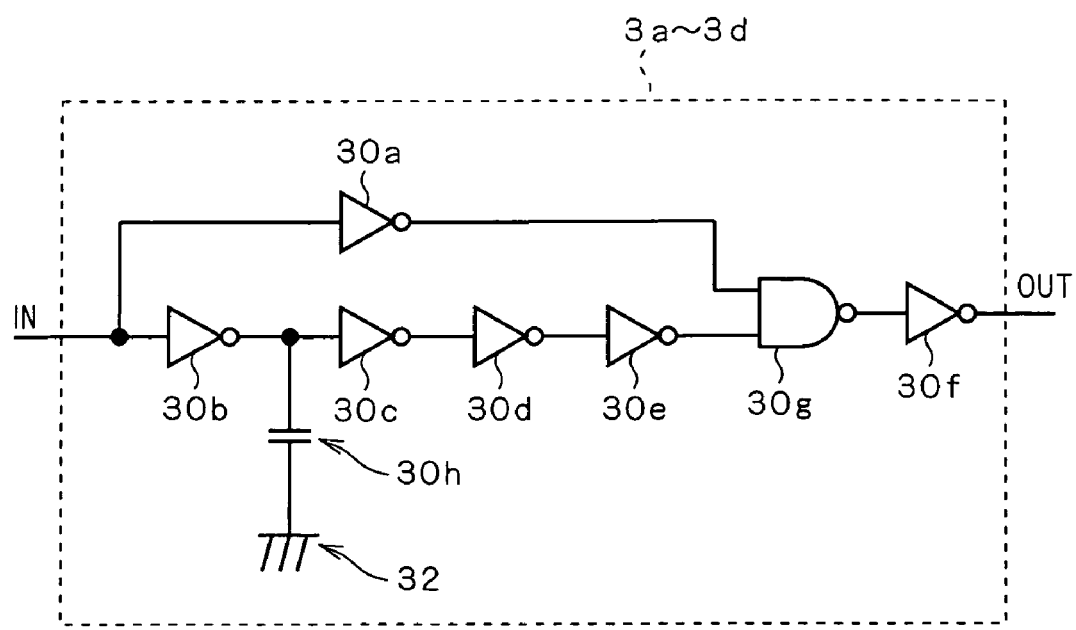
FIG. 4 is a circuit diagram showing the configuration of the one-shot pulse generation circuit 3a according to the first preferred embodiment.

Specifically, as shown in FIG. 4, the one-shot pulse generation circuit consists of inverters 30a to 30f, an NAND circuit 30g, and a capacitor 30h. The input signal into the one-shot pulse generation circuit is input into the inverters 30a and 30b, respectively, which invert and output the respective input signals. The capacitor 30h has one end connected to the output of the inverter 30b and the input of the inverter 30c, and the other end connected to the ground potential 32. The inverter 30c inverts and outputs the output from the inverter 30b, and the inverter 30d inverts and outputs the output from the inverter 30c. The inverter 30e inverts and outputs the output from the inverter 30d, and the NAND circuit 30g operates and outputs the NAND of the outputs from the inverters 30a and 30e. Then, the inverter 30f inverts the output from the NAND circuit 30g and outputs it to the outside of the one-shot pulse generation circuit. The pulse length pw of the pulse signal output from the one-shot pulse generation circuit depends mostly on the capacitance of the capacitor 30h.

Next, the inner configuration of the delay circuit 3h in the pulse generation part 3 will be described in detail. The configuration and operation of the delay circuit 3i are identical to those of the delay circuit 3h and explanations thereof are thus omitted. FIG. 5 is a circuit diagram showing the configuration of the delay circuit 3h. As shown in FIG. 5, the delay circuit 3h includes a constant-current circuit 3ha, an nMOS transistor 3hb, a capacitor 3hc, and an inverter 3hd. The nMOS transistor 3hb has a drain connected to the constant-current circuit 3ha connected to the power supply potential 33, and a source connected to the ground potential 32 and one end of the capacitor 3hc. The other end of the capacitor 3hc is connected to the drain of the nMOS transistor 3hb and the input of the inverter 3hd. The input signal into the delay circuit 3h is supplied to the gate of the nMOS transistor 3hb, and the output from the inverter 3hd is output to the outside of the delay circuit 3h.

When the nMOS transistor 3hb is OFF, namely when the input signal is at a low level, the inverter 3hd outputs a low level due to electric charge accumulated in the capacitor 3hc. Then, when the input signal makes a low level to high level transition and the nMOS transistor 3hb makes an OFF to ON transition, the capacitor 3hc starts being discharged. Upon discharge of the capacitor 3hc, the input voltage at the inverter 3hd drops to become less than the threshold value, when the output from the inverter 3hd makes a low level to high level transition.

Subsequently, when the input signal makes a high level to low level transition and the nMOS transistor 3hb makes an ON to OFF transition, the constant-current circuit 3ha works such that a constant current flows into the capacitor 3hc, whereby the capacitor 3hc starts being charged. Upon accumulation of electric charge in the capacitor 3hc, the input voltage at the inverter 3hd rises to become not less than the threshold value, when the output from the inverter 3hd makes a high level to low level transition. In such ways, the delay time at the delay circuit 3h depends on the capacitance of and the amount of the constant current flowing through the capacitor 3hc.

FIG. 6 shows the specific operation performed by the pulse generation part 3 having the circuit configuration mentioned above. As shown in FIG. 6, when the signal HINS makes a low level to high level transition, the pulse generation part 3 outputs an OFF pulse signal poff1 as the OFF transmission pulse signal OFFS.

Further, after a lapse of time ptd1 after outputting the OFF pulse signal poff1, the pulse generation part 3 outputs an OFF pulse signal poff2 based on the same leading edge of the signal HINS as the OFF pulse signal poff1, namely based on the leading edge of the signal HINS on which the output of the OFF pulse signal poff1 is based.

Then, when the signal HINS makes a high level to low level transition, the pulse generation part 3 outputs an ON pulse signal pon1 as the ON transmission pulse signal ONS. Further, after a lapse of time ptd2 after outputting the ON pulse signal pon1, the pulse generation part 3 outputs an ON pulse signal pon2 based on the same trailing edge of the signal HINS as the ON pulse signal pon1, namely based on the trailing edge of the signal HINS on which the output of the ON pulse signal pon1 is based.

In this manner, the pulse generation part 3 outputs the OFF pulse signals poff1 and poff2 based on the leading edge of the signal HINS, and outputs the ON pulse signals pon1 and pon2 based on the trailing edge thereof. Considering the fact that the signal HINS is an inverse signal of the signal HIN, we can say that the pulse generation part 3 outputs the OFF pulse signals poff1 and poff2 based on the trailing edge of the signal HIN from the outside of the semiconductor device 60, and outputs the ON pulse signals pon1 and pon2 based on the leading edge thereof. The times ptd1 and ptd2 depend mostly on the delay time at the delay circuits.

Figure 7:
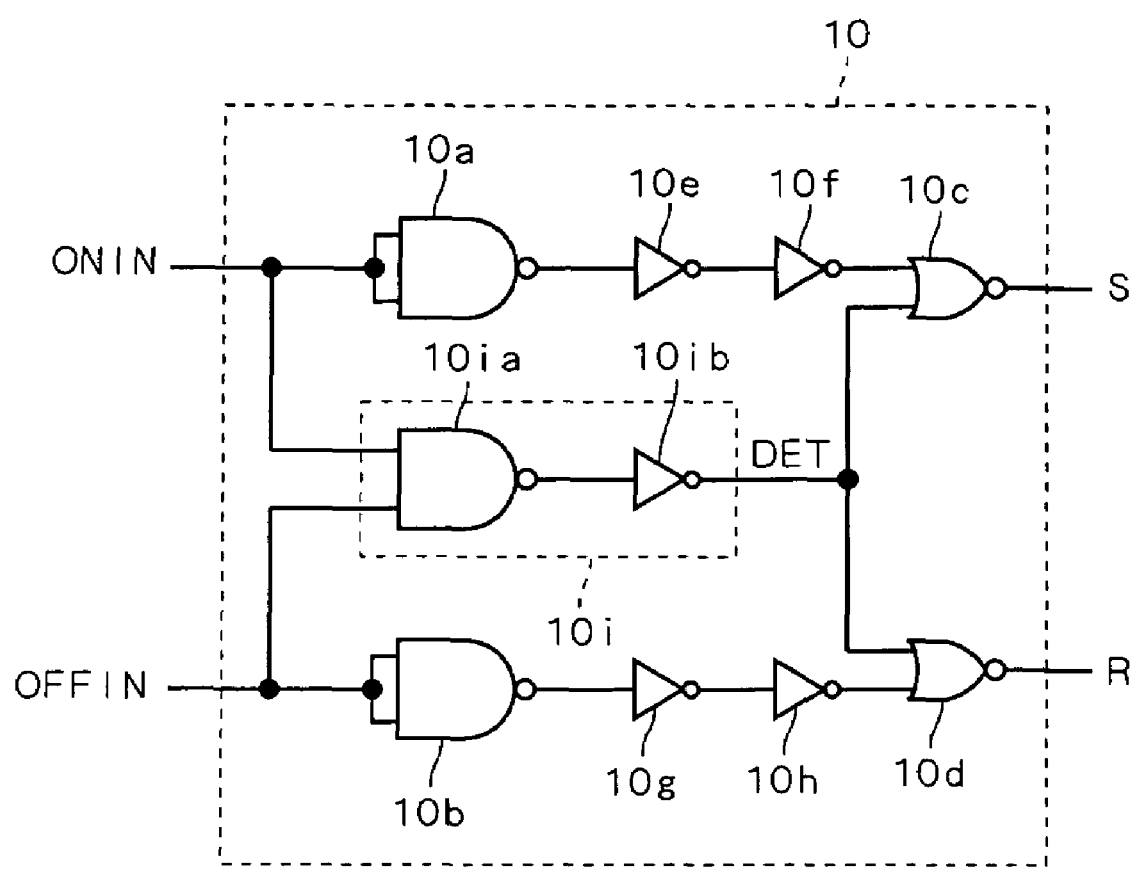
FIG. 7 is a circuit diagram showing the configuration of an interlock circuit 10 according to the first preferred embodiment.

Next, the inner configuration of the interlock circuit 10 in the control part 4 will be described in detail. FIG. 7 is a circuit diagram showing the configuration of the interlock circuit 10. As shown in FIG. 7, the interlock circuit 10 includes NAND circuits 10a and 10b, NOR circuits 10c and 10d, inverters 10e to 10h, and a protective circuit 10i having a NAND circuit 10ia and an inverter 10ib.

The signal ONIN from the inverter 7 is input into both inputs of the NAND circuit 10a and one input of the NAND circuit 10ia. The signal OFFIN from the inverter 8 is input into both inputs of the NAND circuit 10b and the other input of the NAND circuit 10ia. Each of the NAND circuits 10a and 10b operates and outputs the NAND of both the inputs.

The inverter 10e inverts and outputs the output from the NAND circuit 10a, and the inverter 10f inverts and outputs the output from the inverter 10e. The inverter 10g inverts and outputs the output from the NAND circuit 10b, and the inverter 10h inverts and outputs the output from the inverter 10g.

The NAND circuit 10ia in the protective circuit 10i operates and outputs the NAND of the signals ONIN and OFFIN, and the inverter 10ib inverts the output from the NAND circuit 10ia and outputs it as a detection signal DET. The NOR circuit 10c operates the NOR of the output from the inverter 10f and the detection signal DET and outputs it as the signal S to the RS flip-flop circuit 11. The NOR circuit 10d operates the NOR of the output from the inverter 10h and the detection signal DET and outputs it as the signal R to the RS flip-flop circuit 11.

When the input into the interlock circuit 10 having the above configuration is such that the signals ONIN and OFFIN are both at a low level, or that the signal ONIN is at a low level and the signal OFFIN is at a high level, or that the signal ONIN is at a high level and the signal OFFIN is at a low level, the detection signal DET which is an output from the protective circuit 10i becomes a low level, and the logical levels of the signals ONIN and OFFIN are output as they are as the signals S and R, respectively. On the other hand, when the input into the interlock circuit 10 is such that the signals ONIN and OFFIN are both at a high level, the detection signal DET becomes a high level, and low levels are output as both the signals S and R.

Consequently, whatever the combination of the logical levels of the signals ONIN and OFFIN may be, the protective circuit 10i works in such a manner that high levels are not output as both the signals S and R. Since simultaneous inputs of high level signals into the set input and reset input of the RS flip-flop circuit 11 ordinarily renders the logical level of its output uncertain, the simultaneous inputs of a high level into both the inputs of the RS flip-flop circuit 11 is prohibited. The protective circuit 10i as described above is thus provided in the interlock circuit 10 so as not to render the output from the RS flip-flop circuit 11 uncertain.

Figure 8:
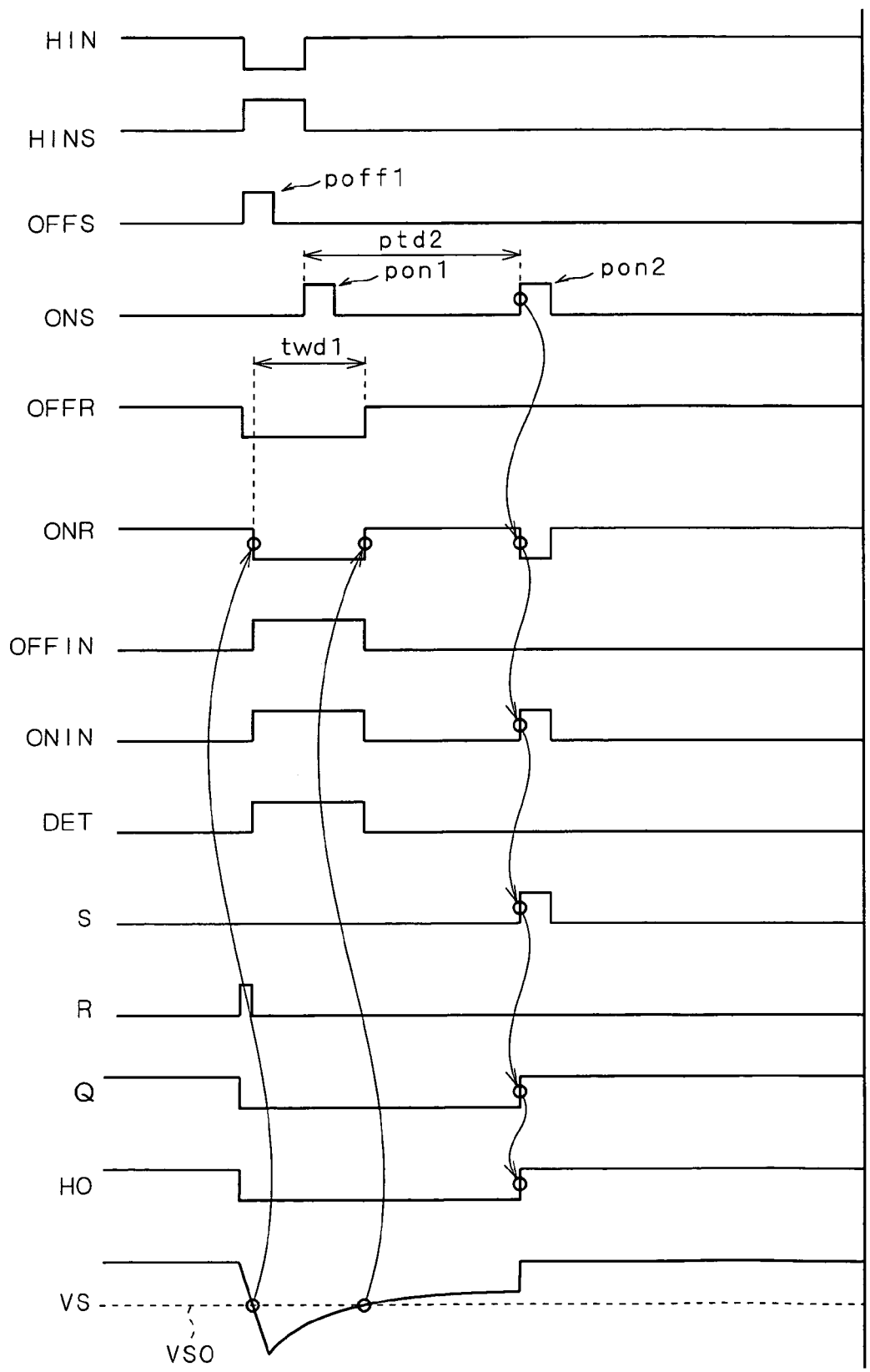
FIGS. 8 and 9 are timing charts showing the operation of the semiconductor device 60 according to the first preferred embodiment.

Next, the operation of the semiconductor device 60 according to the first preferred embodiment will be described with reference to FIG. 8. FIG. 8 is a flowchart showing an exemplary operation of the semiconductor device 60.

Initially, an operation to cause the switching device 40 in the ON state to transition to the OFF state and then to the ON state will be described. When causing the switching device 40 to transition from the ON state to the OFF state, the signal HIN from the outside of the semiconductor device 60 makes a high level to low level transition, as shown in FIG. 8. Following the high level to low level transition of the signal HIN, the pulse generation part 3 outputs the OFF pulse signal poff1 as the OFF transmission pulse signal OFFS. The ON transmission pulse signal ONS remains at a low level.

Following the output of the OFF pulse signal poff1 as the OFF transmission pulse signal OFFS from the pulse generation part 3, the pMOS transistor 14i in the level shift circuit 14 makes an OFF to ON transition, and the nMOS transistor 14j makes an ON to OFF transition. Then, the high breakdown voltage nMOS transistor 14k makes an OFF to ON transition, and each of the bipolar transistors 14l and 14m makes an OFF to ON transition. Consequently, a current flows through the resistor 14n which causes a voltage drop. The result is that the signal OFFR makes a high level to low level transition, and the signal OFFIN makes a low level to high level transition. The low level potential of the signal OFFR is clamped by the diode 14o and is prevented from becoming lower than the potential VS at the node CON1 when the resistor 14n causes the voltage drop.

On the other hand, since the ON transmission pulse signal ONS from the pulse generation part 3 is at a low level, the pMOS transistor 14a in the level shift circuit 14 is not turned on, and the nMOS transistor 14b remains ON. Accordingly, the resistor 14f does not cause a voltage drop, and the signal ONIN remains at a low level.

When the low level signal ONIN and the high level signal OFFIN are input into the interlock circuit 10, the signal R makes a low level to high level transition, while the signal S remains at a low level. Then, when the high level signal R and the low level signal S are input into the RS flip-flop circuit 11, the signal Q makes a high level to low level transition. Consequently, the pMOS transistor 12 and nMOS transistor 13 in an output stage of the control part 4 make ON to OFF and OFF to ON transitions, respectively, and the signal HO makes a high level to low level transition. The result is that an OFF signal, namely a low level signal in the first preferred embodiment, is output based on the OFF pulse signal poff1 from the pulse generation part 3 to the high-potential side switching device 40, thereby bringing the switching device 40 into a non-conducting state.

When the switching device 40 is brought into a non-conducting state, the potential VS at the node CON1 falls from a high level to become a negative potential, and then gradually rises to become a low level, as shown in FIG. 8. At this time, there exists a period during which the sum of the potential VS and the potential at the power source 34 becomes less than the threshold voltage Vth of the inverter 7 (a dotted line VS0 shown in FIG. 8 indicates the potential VS where the sum of the potential VS and the potential at the power source 34 becomes less than the threshold voltage Vth of the inverter 7).

When the high breakdown voltage nMOS transistor 14c in the level shift circuit 14 is OFF, namely the signal level of the signal ONR should be a high level, the signal level of the signal ONR is given by the sum of the potential VS and the potential at the power source 34. Accordingly, the signal ONR is input into the inverter 7 as a low level signal during this period despite the wish to make it a high level signal.

Consequently, the signal ONIN which is an output from the inverter 7 changes from a low level to a high level. The signal ONR is fixed at a low level until after the potential VS rises and the signal level of the signal ONR becomes not less than the threshold voltage Vth at the inverter 7. Likewise, the signal level of the signal OFFR becomes less than the threshold voltage Vth at the inverter 8 and is fixed at a low level.

Stated another way, the control part 4 receives the output potential (potential VS) at the switching device 40 as a reference potential for the signal levels of the signals ONR and OFFR. And the control part 4 is prevented from performing the normal operation for a certain period due to the fixation of the signals ONR and OFFR at a low level resulting from the drop in the reference potential to less than the certain negative potential at switching time from the ON state to the OFF state.

In the following, the period during which the signals ONR and OFFR are fixed at a low level due to the drop in the potential VS to less than the certain negative potential is called a "period twd1". Following the above, the signal ONR makes a high level to low level transition and the signal ONIN makes a low level to high level transition, as shown in FIG. 8.

When the signals ONIN and OFFIN both at a high level are input into the interlock circuit 10, the detection signal DET changes from a low level to a high level, as shown in FIG. 8. The interlock circuit 10 then outputs the signals S and R both at a low level to the RS flip-flop circuit 11. Accordingly, the output from the RS flip-flop circuit 11 is kept, the signal Q maintains a low-level state, and the switching device 40 maintains a non-conducting state.

Subsequently, as shown in FIG. 8, even after the OFF transmission pulse signal OFFS becomes a low level, each of the signals ONIN and OFFIN does not change since the signals ONR and OFFR output from the level shift circuit 14 are both fixed at a low level.

Here, when the input signal HINS makes a low level to high level transition, a signal making a high level to low level transition is input into the delay circuit 3$i$ through the inverter 3$f$ (see FIG. 2). While being input with a high level signal, the delay circuit 3$i$ keeps outputting a high level signal. Then, when input with a low level signal, the capacitor 3$hc$ (see FIG. 5) in the delay circuit 3$i$ starts being charged gradually. When the potential at the capacitor 3$hc$ becomes not less than the threshold voltage at the inverter 3$hd$ after a lapse of the time ptd1, the output from the delay circuit 3$i$ makes a high level to low level transition. The one-shot pulse generation circuit 3$d$ generates a one-shot pulse based on the trailing edge of this transition.

However, in the FIG. 8 example, the input signal HINS makes a transition to a low level again before a lapse of the time ptd1. Accordingly, the potential at the capacitor 3$hc$ (see FIG. 5) constituting the delay circuit 3$i$ is not charged up to the threshold voltage at the inverter 3$hd$, and the output from the delay circuit 3$i$ is maintained at a high level. Therefore, the one-shot pulse generation circuit 3$d$ does not output a one-shot pulse, and thus the pulse generation part 3 does not output the OFF pulse signal poff2.

Next, as shown in FIG. 8, when the signal HIN makes a low level to high level transition during the period twd1, the pulse generation part 3 outputs the ON pulse signal pon1. However, since each of the signals ONR and OFFR is fixed at a low level during the period twd1, the signal S remains at a low level and does not change to a high level. Namely, the ON pulse signal pon1 output from the pulse generation part 3 is ignored. Therefore, the signals Q and HO both maintain a low level state and the switching device 40 maintains a non-conducting state. In such ways, the control part 4 cannot supply an ON signal to the switching device 40 during the period twd1.

However, the pulse generation part 3 according to the first preferred embodiment outputs the ON pulse signal pon2 as the ON transmission pulse signal ONS after a lapse of the time ptd2 after outputting the ON pulse signal pon1, as shown in FIG. 8. The time ptd2 is set greater than the period twd1, i.e. greater than the period during which the signals ONR and OFFR are fixed at a low level. Consequently, the pulse generation part 3 can output the ON pulse signal pon2 after a release of the fixation of the signals ONR and OFFR at a low level.

Following the output of the ON pulse signal pon2 from the pulse generation part 3 after a release of the fixation of the signals ONR and OFFR at a low level, the signal ONR makes a transition to a low level and the signals ONIN and S make a transition to a high level, as shown in FIG. 8. Consequently, the output signal Q from the RS flip-flop circuit 11 makes a low level to high level transition, and the signal HO also makes a low level to high level transition. The result is that an ON signal is supplied to the switching device 40, thereby bringing the switching device 40 into a conducting state. At this time, the driving circuit 50 for the low-potential side switching device 42 outputs a low level, preventing the switching devices 40 and 42 from simultaneously being brought into a conducting state.

As described above, even when a leading edge of the signal HIN occurs during the period twd1 and the ON pulse signal pon1 is ignored, the control part 4 can output an ON signal reliably based on the leading edge of the signal HIN. Consequently, the switching device 40 can be brought into a conducting state reliably based on the leading edge of the signal HIN.

As discussed later, when the signal HO becomes a high level and the switching device 40 is brought into a conducting state, the potential VS rises from a low level to a high level with a certain inclination and the signals ONR and OFFR are fixed at a low level for a certain period. This has no influence on the operation mentioned above and an explanation thereof was thus omitted.

Figure 9:
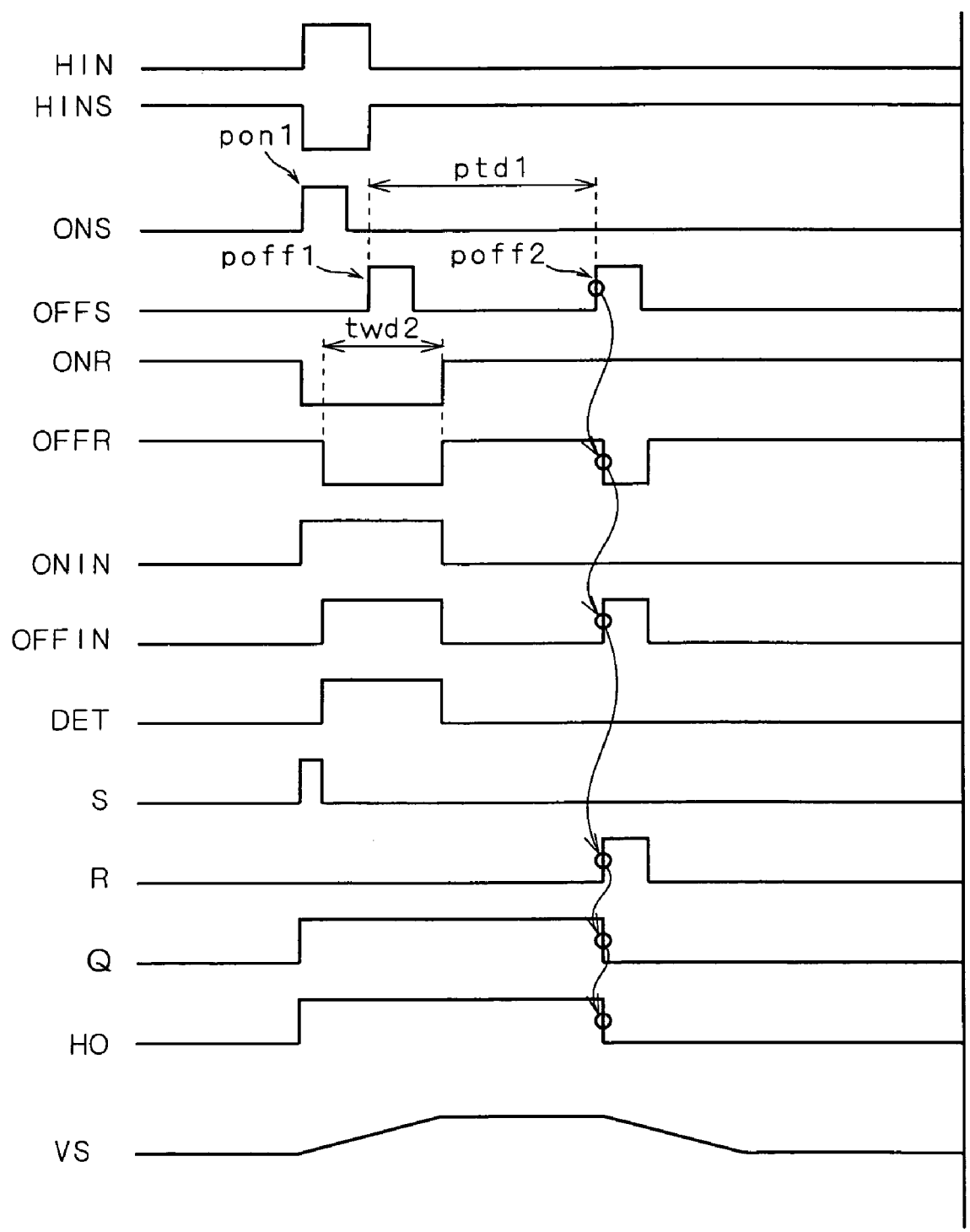

Next, with reference to FIG. 9, an operation to cause the switching device 40 in the OFF state to transition to the ON state and then to the OFF state will be described. Initially, when causing the switching device 40 to transition from the OFF state to the ON state, the signal HIN from the outside of the semiconductor device 60 makes a low level to high level transition, as shown in FIG. 9. Following the low level to high level transition of the signal HIN, the pulse generation part 3 outputs the ON pulse signal pon1 as the ON transmission pulse signal ONS. The OFF transmission pulse signal OFFS remains at a low level.

Following the output of the ON pulse signal pon1 as the ON transmission pulse signal ONS from the pulse generation part 3, the pMOS transistor 14$a$ in the level shift circuit 14 makes an OFF to ON transition, and the nMOS transistor 14$b$ makes an ON to OFF transition. Then, the high breakdown voltage nMOS transistor 14$c$ makes an OFF to ON transition, and each of the bipolar transistors 14$d$ and 14$e$ makes an OFF to ON transition. Consequently, a current flows through the resistor 14$f$ which causes a voltage drop. The result is that the signal ONR makes a high level to low level transition, and the signal ONIN makes a low level to high level transition. The low level potential of the signal ONR is clamped by the diode 14$g$ and is prevented from becoming lower than the potential VS at the node CON1 when the resistor 14$f$ causes the voltage drop.

On the other hand, since the OFF transmission pulse signal OFFS from the pulse generation part 3 is at a low level, the pMOS transistor 14$i$ in the level shift circuit 14 is not turned on, and the NMOS transistor 14$j$ remains ON. Accordingly, the resistor 14$n$ does not cause a voltage drop, and the signal OFFIN remains at a low level.

When the high level signal ONIN and the low level signal OFFIN are input into the interlock circuit 10, the signal S makes a low level to high level transition, while the signal R remains at a low level. Then, when the high level signal S and the low level signal R are input into the RS flip-flop circuit 11, the signal Q makes a low level to high level transition. Consequently, the pMOS transistor 12 and nMOS transistor 13 in the output stage of the control part 4 make OFF to ON and ON to OFF transitions, respectively, and the signal HO makes a low level to high level transition. The result is that an ON signal, namely a high level signal in the first preferred embodiment, is output based on the ON pulse signal pon1 from the pulse generation part 3 to the high-potential side switching device 40, thereby bringing the switching device 40 into a conducting state and supplying power to the load. At this time, the driving circuit 50 for the low-potential side switching device 42 outputs a low level, preventing the switching devices 40 and 42 from simultaneously being brought into a conducting state.

When the switching device 40 is brought into a conducting state, the potential VS at the node CON1 rises to change from a low level to a high level, as shown in FIG. 9. The rising potential VS is called a "dV/dt transient signal". Namely, when the switching device 40 is brought into a conducting state, the dV/dt transient signal is generated at the node CON1.

Upon application of the dV/dt transient signal to the node CON1, parasitic capacitance Cds between each drain of the high breakdown voltage nMOS transistors 14c and 14k in an output stage of the level shift circuit 14 and a semiconductor substrate on which each of the transistors 14c and 14k is formed causes a displacement current I to flow through each of the high breakdown voltage nMOS transistors 14c and 14k, respectively. This displacement current I is expressed by the parasitic capacitance Cds and the rate of potential change dV/dt of the dV/dt transient signal, as $I=Cds \cdot dV/dt$.

When the displacement current I flows through the high breakdown voltage nMOS transistor 14k, the resistor 14n causes a voltage drop. The displacement current I causes the signal level of the signal OFFR to become less than the threshold voltage Vth at the inverter 8, whereby the signal OFFR becomes a low level. Thus, the signal OFFIN which is an output from the inverter 8 changes from a low level to a high level. Then, the signal level of the signal OFFR is kept at less than the threshold voltage Vth at the inverter 8 for a certain period. Namely, the signal OFFR is fixed at a low level for the certain period. On the other hand, the displacement current I flowing through the high breakdown voltage nMOS transistor 14c causes the signal ONR to be fixed at a low level as well, for a certain period during the application of the dV/dt transient signal. Put simply, the signal ONR remains at a low level state during that period even if the logical level of the ON transmission pulse signal ONS changes. In the following, the period during which the signals ONR and OFFR are fixed at a low level due to the displacement current I is called a "period twd2".

Following the above, the signal OFFR makes a high level to low level transition and the signal OFFIN makes a low level to high level transition, as shown in FIG. 9. The signal OFFR is fixed at a low level for the period twd2.

When the signals ONIN and OFFIN both at a high level are input into the interlock circuit 10, the detection signal DET changes from a low level to a high level, and the signal S makes a high level to low level transition, as shown in FIG. 9. At this time, the signal R remains at a low level. Accordingly, the output from the RS flip-flop circuit 11 is kept, the signal Q maintains a high level state, and the switching device 40 maintains a conducting state.

Subsequently, as shown in FIG. 9, even after the pulse generation part 3 finishes outputting the ON pulse signal pon1 and the ON transmission pulse signal ONS becomes a low level, each of the signals ONIN and OFFIN does not change since the signals ONR and OFFR output from the level shift circuit 14 are both fixed at a low level.

Here, when the input signal HINS makes a high level to low level transition, a signal making a high level to low level transition is input into the delay circuit 3h (see FIG. 2). While being input with a high level signal, the delay circuit 3h keeps outputting a high level signal. Then, when input with a low level signal, the capacitor 3hc (see FIG. 5) in the delay circuit 3h starts being charged gradually. When the potential at the capacitor 3hc becomes not less than the threshold voltage at the inverter 3hd after a lapse of the time ptd2, the output from the delay circuit 3h makes a high level to low level transition. The one-shot pulse generation circuit 3b generates a one-shot pulse based on the trailing edge of this transition.

However, in the FIG. 9 example, the input signal HINS makes a transition to a high level before a lapse of the time ptd2. Accordingly, the potential at the capacitor 3hc (see FIG. 5) constituting the delay circuit 3h is not charged up to the threshold voltage at the inverter 3hd, and the output from the delay circuit 3h is maintained at a high level. Therefore, the one-shot pulse generation circuit 3b does not output a one-shot pulse, and thus the pulse generation part 3 does not output the ON pulse signal pon2.

Next, as shown in FIG. 9, when the signal HIN makes a high level to low level transition during the period twd2, the pulse generation part 3 outputs the OFF pulse signal poff1. However, since each of the signals ONR and OFFR is fixed at a low level during the period twd2, the signal R remains at a low level and does not change to a high level. Namely, the OFF pulse signal poff1 output from the pulse generation part 3 is ignored. Therefore, the signals Q and HO both maintain a high level state and the switching device 40 maintains a conducting state. In such ways, the control part 4 cannot supply an OFF signal to the switching device 40 during the period twd2.

However, the pulse generation part 3 according to the first preferred embodiment outputs the OFF pulse signal poff2 as the OFF transmission pulse signal OFFS after a lapse of the time ptd1 after outputting the OFF pulse signal poff1, as shown in FIG. 9. The time ptd1 is set greater than the period twd2, i.e. greater than the period during which the signals ONR and OFFR are fixed at a low level. Consequently, the pulse generation part 3 can output the OFF pulse signal poff2 after a release of the fixation of the signals ONR and OFFR at a low level.

Following the output of the OFF pulse signal poff2 from the pulse generation part 3 after a release of the fixation of the signals ONR and OFFR at a low level, the signal OFFR makes a transition to a low level and the signals OFFIN and R make a transition to a high level, as shown in FIG. 9. Consequently, the output signal Q from the RS flip-flop circuit 11 makes a high level to low level transition, and the signal HO also makes a high level to low level transition. The result is that an OFF signal is supplied to the switching device 40, thereby bringing the switching device 40 into a non-conducting state.

As described above, even when a trailing edge of the signal HIN occurs during the period twd2 and the OFF pulse signal poff1 is ignored, the control part 4 can output an OFF signal reliably based on the trailing edge of the signal HIN.

Consequently, the switching device 40 can be brought into a non-conducting state reliably based on the trailing edge of the signal HIN.

As discussed above, when the signal HO becomes a low level and the switching device 40 is brought into a non-conducting state, the potential VS becomes less than the certain negative potential, whereby the signals ONR and OFFR are fixed at a low level for the certain period. This has no influence on the operation mentioned above and an explanation thereof was thus omitted.

In the semiconductor device 60 according to the first preferred embodiment, the pulse generation part 3 outputs the ON pulse signal pon2 after a lapse of the time ptd2 after outputting the ON pulse signal pon1, and the time ptd2 is set greater than the period twd1 during which the signals ONR and OFFR are fixed at a low level due to the drop in the potential VS to become less than the certain negative potential. Therefore, even if the control part 4 does not output an ON signal during the period twd1, the control part 4 can output an ON signal reliably based on the leading edge of the signal HIN. The result is that the switching device 40 can be brought into a conducting state reliably based on the leading edge of the signal HIN.

Further, the pulse generation part 3 outputs the OFF pulse signal poff2 after a lapse of the time ptd1 after outputting the OFF pulse signal poff1, and the time ptd1 is set greater than the period twd2 during which the signals ONR and OFFR are fixed at a low level due to the displacement current I. Therefore, even if the control part 4 does not output an OFF signal during the period twd2, the control part 4 can output an OFF signal reliably based on the trailing edge of the signal HIN. The result is that the switching device 40 can be brought into a non-conducting state reliably based on the trailing edge of the signal HIN.

There is no need for the pulse length pw of each of the ON pulse signals pon1, pon2 and the OFF pulse signals poff1, poff2 to be the same length.

Second Preferred Embodiment

Figure 10:
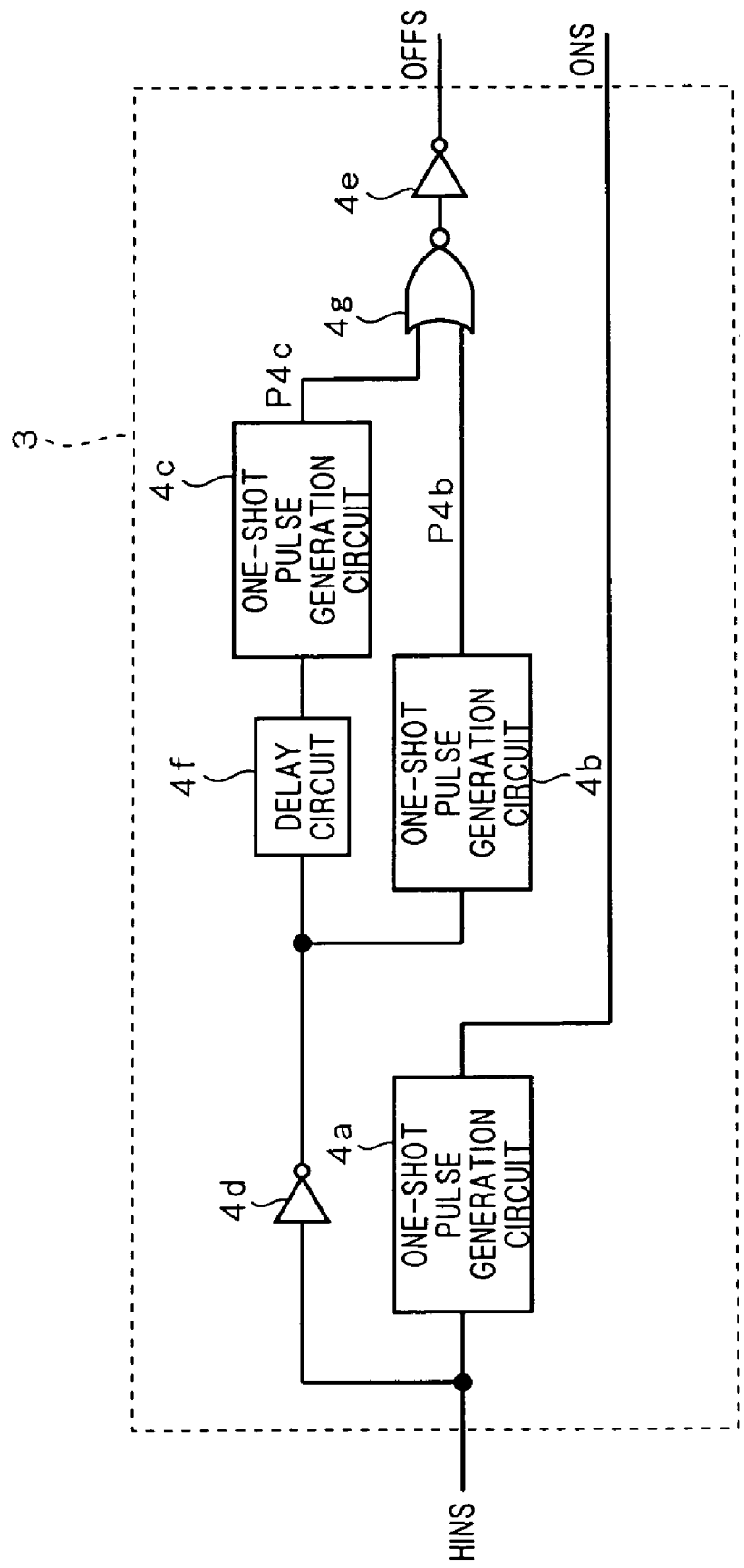
FIG. 10 is a block diagram showing the configuration of the pulse generation part 3 according to a second preferred embodiment of the invention.

FIG. 10 is a block diagram showing the configuration of the pulse generation part 3 (see FIG. 1) constituting the semiconductor device 60 according to a second preferred embodiment of the invention. The other elements constituting the semiconductor device 60 are the same as those in the first preferred embodiment and denoted by the same reference numerals, to omit a redundant description.

Figure 11:
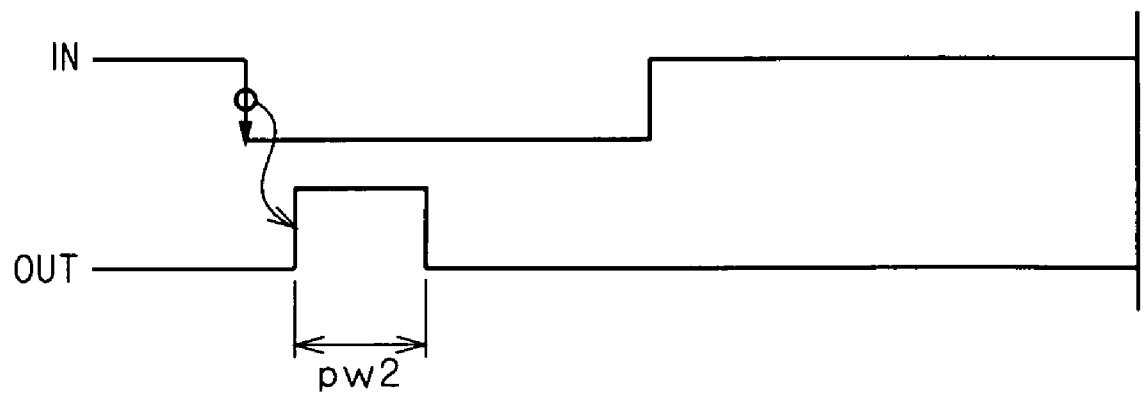
FIG. 11 shows the operation of a one-shot pulse generation circuit 4a according to the second preferred embodiment.

As shown in FIG. 10, the pulse generation part 3 includes one-shot pulse generation circuits 4a to 4c, inverters 4d and 4e, a delay circuit 4f, and an NOR circuit 4g. The one-shot pulse generation circuit 4a is adjusted to output a one-shot pulse having a pulse length pw2 greater than the period twd1 based on the trailing edge of the input signal, as shown in FIG. 11. This pulse length pw2 is set by properly adjusting the capacitance of the capacitor 30h (see FIG. 4) in the one-shot pulse generation circuit 4a.

The signal HINS input from the I/F part 2 is input into the one-shot pulse generation circuit 4a and the inverter 4d. The one-shot pulse generation circuit 4a outputs the ON transmission pulse signal ONS based on the signal HINS, while the inverter 4d inverts and outputs the signal HINS. The one-shot pulse generation circuit 4b outputs a signal P4b based on the output from the inverter 4d, while the delay circuit 4f delays the output from the inverter 4d by a prescribed time interval and outputs it. The one-shot pulse generation circuit 4c outputs a signal P4c based on the output from the delay circuit 4f, and the NOR circuit 4g operates and outputs the NOR of the signals P4b and P4c. Then, the inverter 4e inverts the output from the NOR circuit 4g and outputs it as the OFF transmission pulse signal OFFS.

Figure 12:
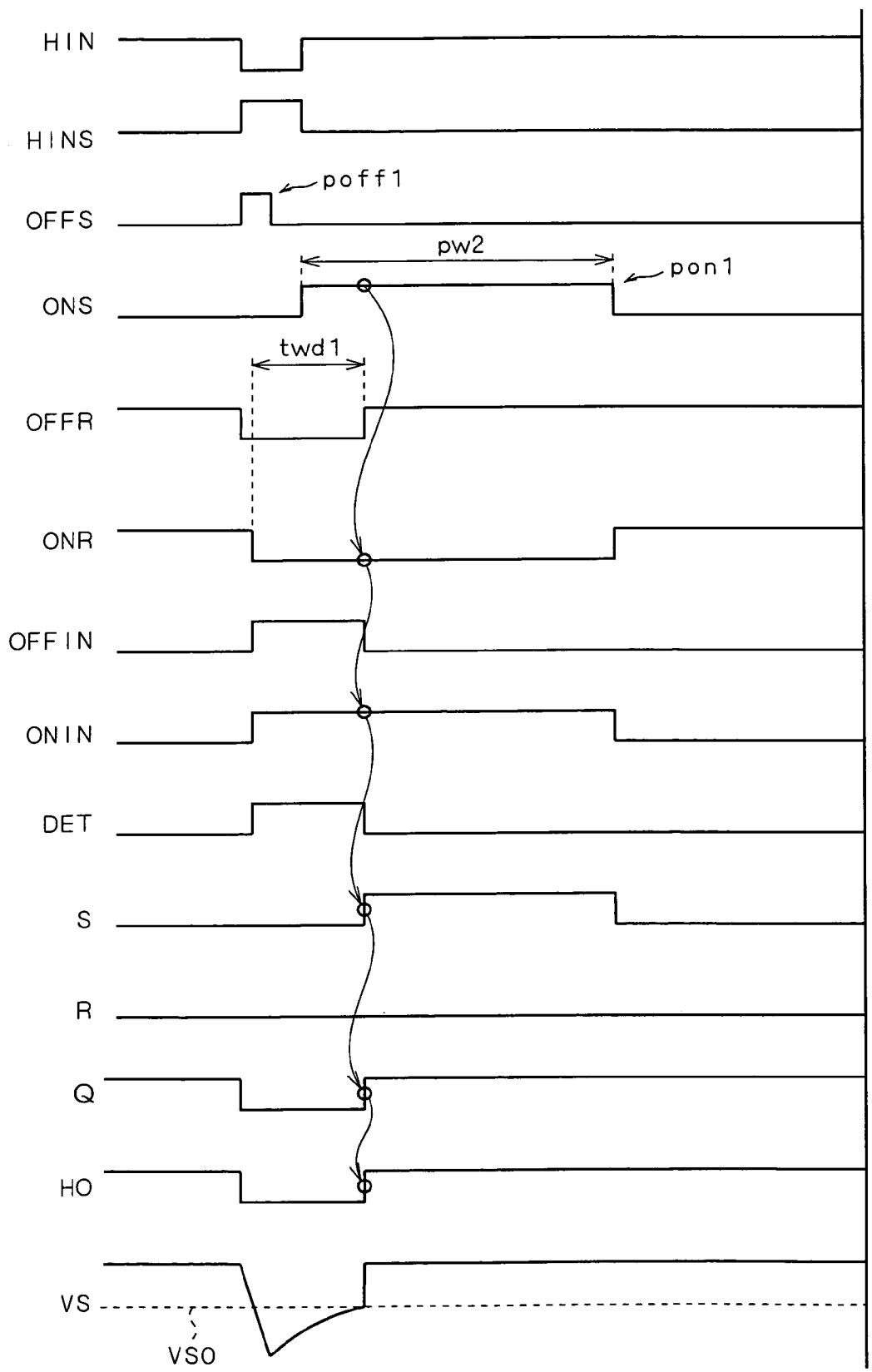
FIG. 12 is a timing chart showing the operation of the semiconductor device 60 according to the second preferred embodiment.

Next, the operation of the semiconductor device 60 according to the second preferred embodiment will be described with reference to FIG. 12. FIG. 12 is a flowchart showing an exemplary operation of the semiconductor device 60.

Initially, when causing the switching device 40 to transition from the ON state to the OFF state, the signal HIN from the outside of the semiconductor device 60 makes a high level to low level transition, as shown in FIG. 12. Following the high level to low level transition of the signal HIN, the driving circuit 1 is activated, the signal HO makes a high level to low level transition, and an OFF signal is supplied to the switching device 40, thereby bringing the switching device 40 into a non-conducting state. When the switching device 40 is turned off, the potential VS at the node CON1 drops to become less than a certain negative voltage, when the signals ONR and OFFR are fixed at a low level.

Then, as shown in FIG. 12, when the signal HIN makes a low level to high level transition during the period twd1, the pulse generation part 3 outputs the ON pulse signal pon1. However, since each of the signals ONR and OFFR is fixed at a low level during the period twd1, the signal S remains at a low level and does not change to a high level. Namely, the ON pulse signal pon1 output from the pulse generation part 3 is ignored. Therefore, the signals Q and HO both maintain a low level state and the switching device 40 maintains a non-conducting state. In such ways, the control part 4 cannot supply an ON signal to the switching device 40 during the period twd1.

Stated another way, the control part 4 receives the output potential (potential VS) at the switching device 40 as a reference potential for the signal levels of the signals ONR and OFFR. And the control part 4 is prevented from performing the normal operation for the period twd1 due to the fixation of the signals ONR and OFFR at a low level resulting from the drop in the reference potential to less than the certain negative potential at switching time from the ON state to the OFF state.

The pulse length pw2 is set greater than the period twd1, i.e. greater than the period during which the signals ONR and OFFR are fixed at a low level. Consequently, after a release of the fixation of the signals ONR and OFFR at a low level, the signal ONR is maintained at a low level, while the signal OFFR makes a low level to high level transition.

Then, the signals ONIN and S make a transition to a high level, while the signals OFFIN and R make a transition to a low level. The output signal Q from the RS flip-flop circuit 11 makes a low level to high level transition, and the signal HO also makes a low level to high level transition. The result is that an ON signal is supplied to the switching device 40, thereby bringing the switching device 40 into a conducting state. At this time, the driving circuit 50 for the low-potential side switching device 42 outputs a low level, preventing the switching devices 40 and 42 from simultaneously being brought into a conducting state.

As described above, in the semiconductor device 60 according to the second preferred embodiment, the pulse generation part 3 outputs the ON pulse signal pon1 having the pulse length pw2, and the pulse length pw2 is set greater than the period twd1 during which the signals ONR and OFFR are fixed at a low level due to the drop in the potential VS to become less than the certain negative potential. Therefore, even if the control part 4 does not output an ON signal during the period twd1, the control part 4 can output an ON signal reliably based on the leading edge of the signal HIN. The result is that the switching device 40 can be brought into a conducting state reliably based on the leading edge of the signal HIN.

Also in the second preferred embodiment, when causing the switching device 40 to transition from the ON state to the OFF state, the pulse generation part 3 outputs the OFF pulse signal poff2 after a lapse of the time ptd1 after outputting the OFF pulse signal poff1, and the time ptd1 is set greater than the period twd2 during which the signals ONR and OFFR are fixed at a low level due to the displacement current I. Therefore, even if the control part 4 does not output an OFF signal during the period twd2, the control part 4 can output an OFF signal reliably based on the trailing edge of the signal HIN. The result is that the switching device 40 can be brought into a non-conducting state reliably based on the trailing edge of the signal HIN.

Third Preferred Embodiment

Figure 13:
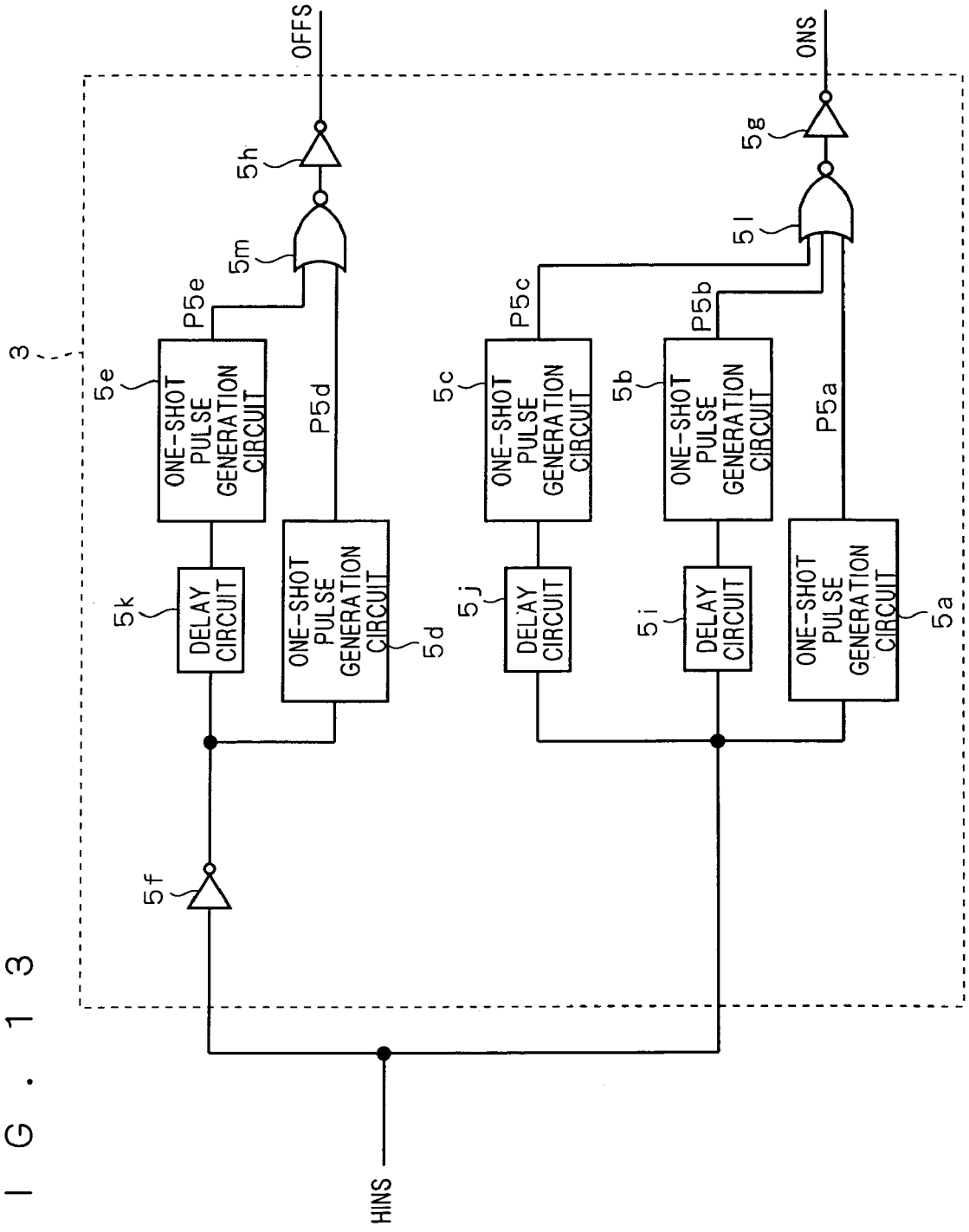
FIG. 13 is a block diagram showing the configuration of the pulse generation part 3 according to a third preferred embodiment of the invention.

FIG. 13 is a block diagram showing the configuration of the pulse generation part 3 (see FIG. 1) constituting the semiconductor device 60 according to a third preferred embodiment of the invention. The other elements constituting the semiconductor device 60 are the same as those in the first preferred embodiment and denoted by the same reference numerals, to omit a redundant description. As shown in FIG. 13, the pulse generation part 3 includes one-shot pulse generation circuits 5a to 5e, inverters 5f to 5h, delay circuits 5i to 5k, and NOR circuits 5l and 5m. The configurations and operations of these one-shot pulse generation circuits and delay circuits are the same as those in the first preferred embodiment and explanations thereof are thus omitted.

The signal HINS input from the I/F part 2 branches into two signals. One signal HINS is input into the inverter 5f which inverts and outputs the signal HINS. The one-shot pulse generation circuit 5d outputs a signal P5d based on the output from the inverter 5f, while the delay circuit 5k delays the output from the inverter 5f by a prescribed time interval and outputs it. The one-shot pulse generation circuit 5e outputs a signal P5e based on the output from the delay circuit 5k, and the NOR circuit 5m operates and outputs the NOR of the signals P5d and P5e. Then, the inverter 5h inverts the output from the NOR circuit 5m and outputs it as the OFF transmission pulse signal OFFS.

The other signal HINS is input into the one-shot pulse generation circuit 5a, the delay circuit 5i and the delay circuit 5j. The one-shot pulse generation circuit 5a outputs a signal P5a based on the signal HINS, while the delay circuit 5i delays the signal HINS by a prescribed time interval and outputs it. The one-shot pulse generation circuit 5b outputs a signal P5b based on the output from the delay circuit 5i.

The delay circuit 5j delays the signal HINS by a prescribed time interval and outputs it. The delay time at the delay circuit 5j is set longer than that at the delay circuit 5i. The one-shot pulse generation circuit 5c outputs a signal P5c based on the output from the delay circuit 5j.

The NOR circuit 5l operates and outputs the NOR of the signals P5a, P5b and P5c. Then, the inverter 5g inverts the output from the NOR circuit 5l and outputs it as the ON transmission pulse signal ONS.

Figure 14:
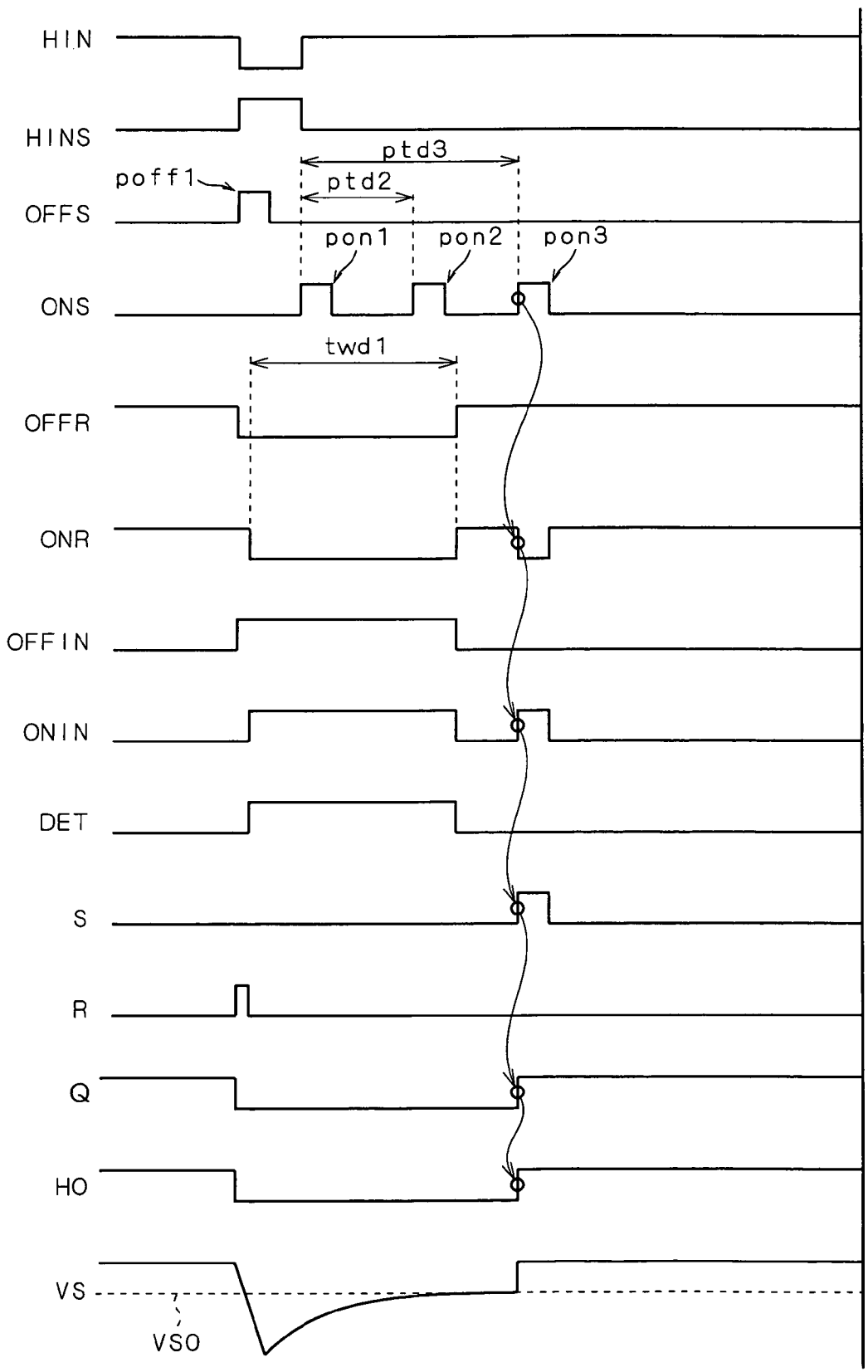
FIG. 14 is a timing chart showing the operation of the semiconductor device 60 according to the third preferred embodiment.

Next, the operation of the semiconductor device 60 according to the third preferred embodiment will be described with reference to FIG. 14. FIG. 14 is a flowchart showing an exemplary operation of the semiconductor device 60.

Initially, when causing the switching device 40 to transition from the ON state to the OFF state, the signal HIN from the outside of the semiconductor device 60 makes a high level to low level transition, as shown in FIG. 14. Following the high level to low level transition of the signal HIN, the driving circuit 1 is activated, the signal HO makes a high level to low level transition, and an OFF signal is supplied to the switching device 40, thereby bringing the switching device 40 into a non-conducting state.

When the switching device 40 is turned off, the potential VS at the node CON1 drops to become less than a certain negative voltage, when the signals ONR and OFFR are fixed at a low level. Then, as shown in FIG. 14, when the signal HIN makes a low level to high level transition during the period twd1, the pulse generation part 3 outputs the ON pulse signal pon1. The pulse generation part 3 subsequently outputs the ON pulse signal pon2 as the ON transmission pulse signal ONS after a lapse of the time ptd2 after outputting the ON pulse signal pon1, as shown in FIG. 14.

However, since each of the signals ONR and OFFR is fixed at a low level during the period twd1, the signal S remains at a low level and does not change to a high level. Namely, the ON pulse signals pon1 and pon2 output from the pulse generation part 3 are ignored. Therefore, the signals Q and HO both maintain a low level state and the switching device 40 maintains a non-conducting state.

Subsequently, the pulse generation part 3 outputs an ON pulse signal pon3 as the ON transmission pulse signal ONS after a lapse of time ptd3 after outputting the ON pulse signal pon1, as shown in FIG. 14. The time ptd3 is set greater than the period twd1, i.e. greater than the period during which the signals ONR and OFFR are fixed at a low level. Consequently, the pulse generation part 3 can output the ON pulse signal pon3 after a release of the fixation of the signals ONR and OFFR at a low level.

Following the above, the signal ONR makes a transition to a low level and the signals ONIN and S make a transition to a high level, as shown in FIG. 14. Consequently, the output signal Q from the RS flip-flop circuit 11 makes a low level to high level transition, and the signal HO also makes a low level to high level transition. The result is that an ON signal is supplied to the switching device 40, thereby bringing the switching device 40 into a conducting state.

As described above, in the semiconductor device 60 according to the third preferred embodiment, the pulse generation part 3 outputs the ON pulse signals pon1, pon2 and pon3. Accordingly, even if the ON pulse signals pon1 and pon2 are output during the period twd1 that is prolonged than imagined and hence the control part 4 fails to output an ON signal, the ON pulse signal pon3 allows the control part 4 to output an ON signal reliably based on the leading edge of the signal HIN in the third preferred embodiment. The result is that the switching device 40 can be brought into a conducting state reliably based on the leading edge of the signal HIN, thereby performing even more reliable control.

Also in the third preferred embodiment, when causing the switching device 40 to transition from the ON state to the OFF state, the pulse generation part 3 outputs the OFF pulse signal poff2 after a lapse of the time ptd1 after outputting the OFF pulse signal poff1, and the time ptd1 is set greater than the period twd2 during which the signals ONR and OFFR are fixed at a low level due to the displacement current I. Therefore, even if the control part 4 does not output an OFF signal during the period twd2, the control part 4 can output an OFF signal reliably based on the trailing edge of the signal HIN. The result is that the switching device 40 can be brought into a non-conducting state reliably based on the trailing edge of the signal HIN.

Fourth Preferred Embodiment

Figure 15:
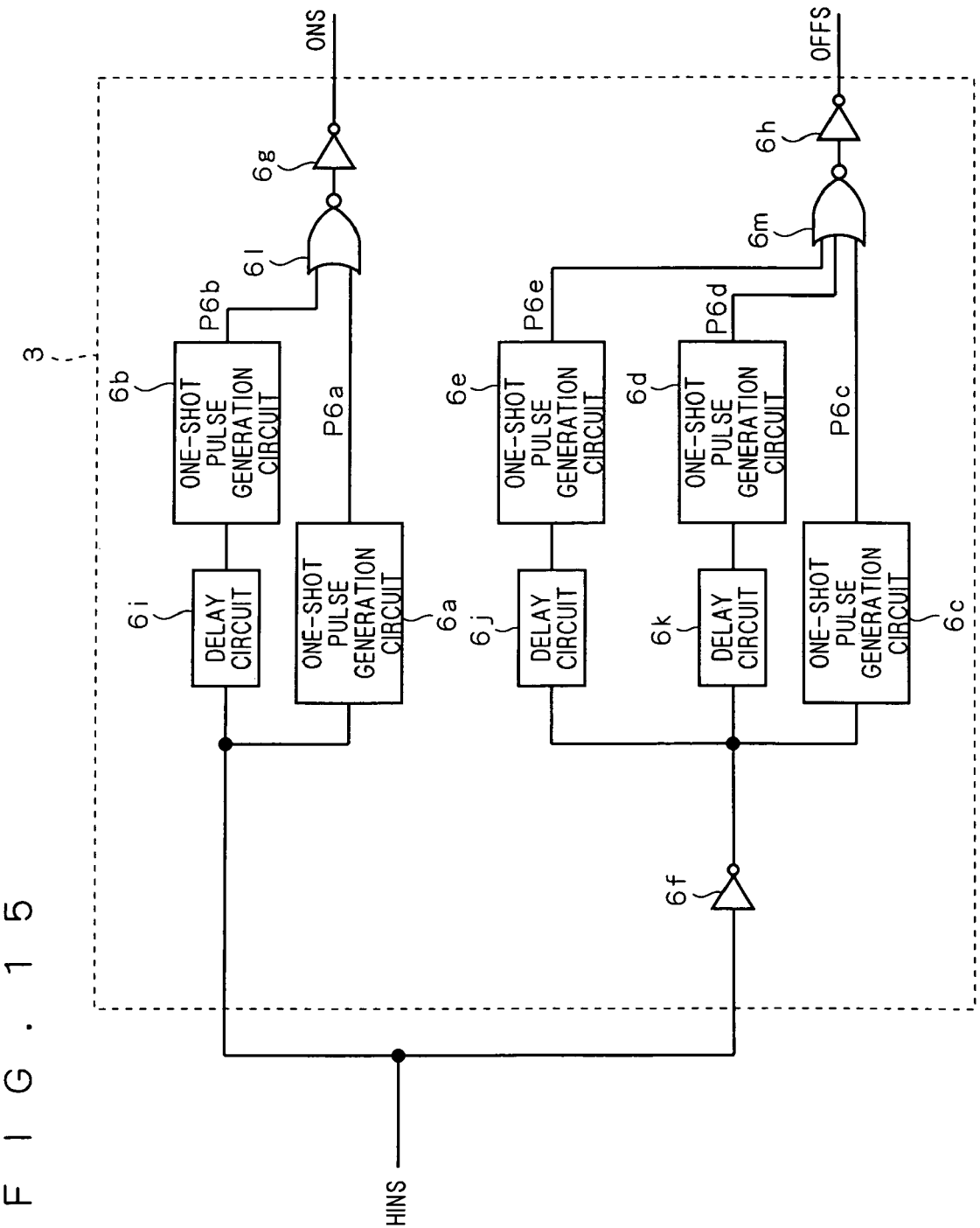
FIG. 15 is a block diagram showing the configuration of the pulse generation part 3 according to a fourth preferred embodiment of the invention.

FIG. 15 is a block diagram showing the configuration of the pulse generation part 3 (see FIG. 1) constituting the semiconductor device 60 according to a fourth preferred embodiment of the invention. The other elements constituting the semiconductor device 60 are the same as those in the first preferred embodiment and denoted by the same reference numerals, to omit a redundant description. As shown in FIG. 15, the pulse generation part 3 includes one-shot pulse generation circuits 6a to 6e, inverters 6f to 6h, delay circuits 6i to 6k, and NOR circuits 6l and 6m. The configurations and operations of these one-shot pulse generation circuits and the delay circuits are the same as those in the first preferred embodiment and explanations thereof are thus omitted.

The signal HINS input from the I/F part 2 branches into two signals. One signal HINS is input into the inverter 6f which inverts and outputs the signal HINS. The one-shot pulse generation circuit 6c outputs a signal P6c based on the output from the inverter 6f, while the delay circuit 6k delays the output from the inverter 6f by a prescribed time interval and outputs it. The one-shot pulse generation circuit 6d outputs a signal P6d based on the output from the delay circuit 6k.

The delay circuit 6j delays the output from the inverter 6f by a prescribed time interval and outputs it. The delay time at the delay circuit 6j is set longer than that at the delay circuit 6k. The one-shot pulse generation circuit 6e outputs a signal P6e based on the output from the delay circuit 6j. The three-input NOR circuit 6m operates and outputs the NOR of the signals P6c, P6d and P6e. Then, the inverter 6h inverts the output from the NOR circuit 6m and outputs it as the OFF transmission pulse signal OFFS.

The other signal HINS is input into the one-shot pulse generation circuit 6a and delay circuit 6i. The one-shot pulse generation circuit 6a outputs a signal P6a based on the signal HINS, while the delay circuit 6i delays the signal HINS by a prescribed time interval and outputs it. The one-shot pulse generation circuit 6b outputs a signal P6b based on the output from the delay circuit 6i. The NOR circuit 6l operates and outputs the NOR of the signals P6a and P6b. Then, the inverter 6g inverts the output from the NOR circuit 6l and outputs it as the ON transmission pulse signal ONS.

Figure 16:
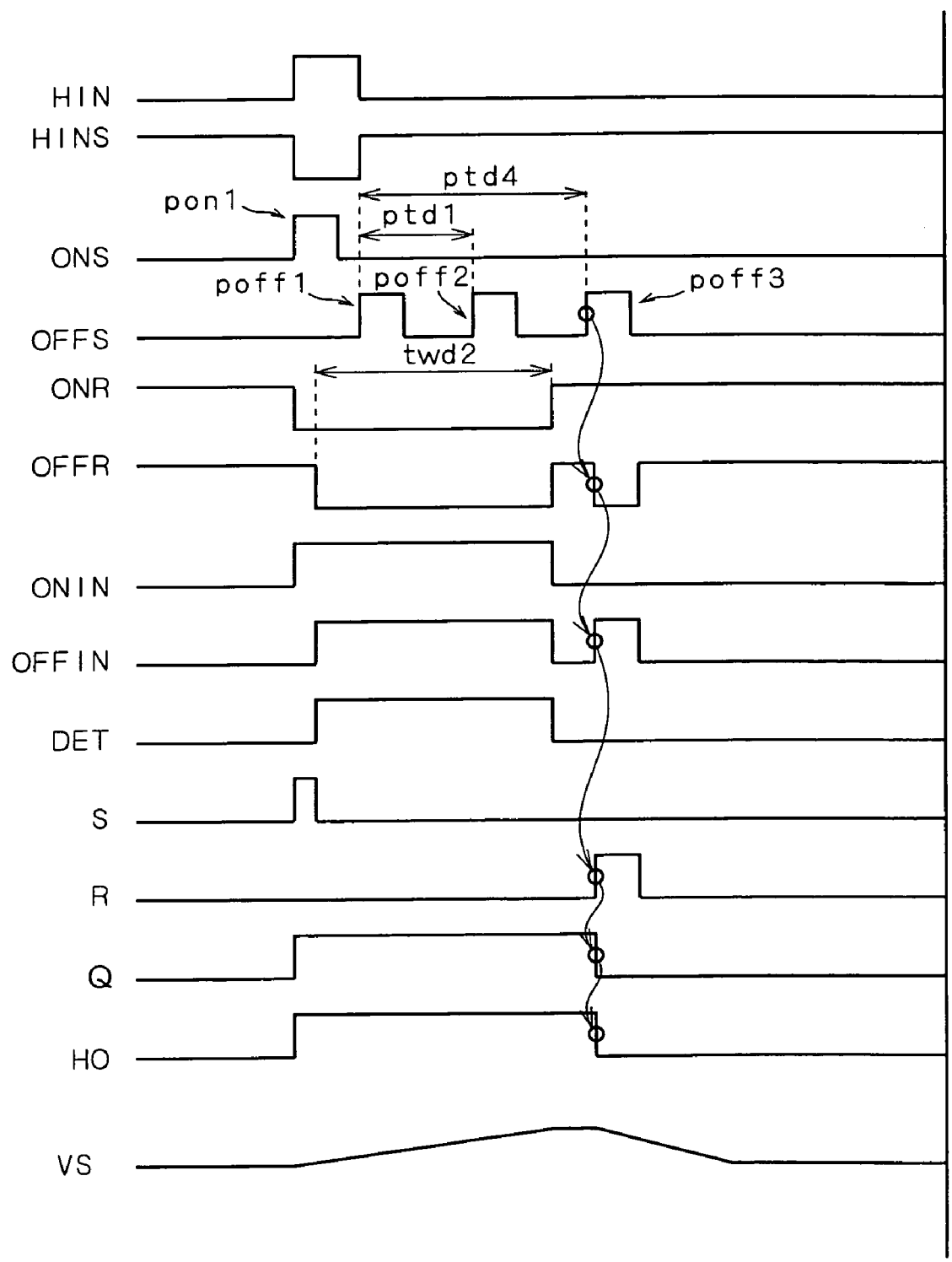
FIG. 16 is a timing chart showing the operation of the semiconductor device 60 according to the fourth preferred embodiment.

Next, the operation of the semiconductor device 60 according to the fourth preferred embodiment will be described with reference to FIG. 16. FIG. 16 is a flowchart showing an exemplary operation of the semiconductor device 60.

Initially, when causing the switching device 40 to transition from the OFF state to the ON state, the signal HIN from the outside of the semiconductor device 60 makes a low level to high level transition, as shown in FIG. 16. Following the low level to high level transition of the signal HIN, the driving circuit 1 is activated, the signal HO makes a low level to high level transition, and an ON signal is supplied to the switching device 40, thereby bringing the switching device 40 into a conducting state.

When the switching device 40 is turned on, the dV/dt transient signal is applied to the node CON1 to generate the displacement current I, whereby the signals ONR and OFFR are fixed at a low level. Then, as shown in FIG. 16, when the signal HIN makes a high level to low level transition during the period twd2, the pulse generation part 3 outputs the OFF pulse signal poff1.

The pulse generation part 3 subsequently outputs the OFF pulse signal poff2 as the OFF transmission pulse signal OFFS after a lapse of the time ptd1 after outputting the OFF pulse signal poff1, as shown in FIG. 16. However, since each of the signals ONR and OFFR is fixed at a low level during the period twd2, the signal R remains at a low level and does not change to a high level. Namely, the OFF pulse signals poff1 and poff2 output from the pulse generation part 3 are ignored. Therefore, the signals Q and HO both maintain a high level state and the switching device 40 maintains a conducting state.

Subsequently, the pulse generation part 3 outputs an OFF pulse signal poff3 as the OFF transmission pulse signal OFFS after a lapse of time ptd4 after outputting the OFF pulse signal poff1, as shown in FIG. 16. The time ptd4 is set greater than the period twd2, i.e. greater than the period during which the signals ONR and OFFR are fixed at a low level. Consequently, the pulse generation part 3 can output the OFF pulse signal poff3 after a release of the fixation of the signals ONR and OFFR at a low level.

Following the above, the signal OFFR makes a transition to a low level and the signals OFFIN and R make a transition to a high level after a release of the fixation of the signals ONR and OFFR at a low level, as shown in FIG. 16. Consequently, the output signal Q from the RS flip-flop circuit 11 makes a high level to low level transition, and the signal HO also makes a high level to low level transition. The result is that an OFF signal is supplied to the switching device 40, thereby bringing the switching device 40 into a non-conducting state.

As described above, in the semiconductor device 60 according to the fourth preferred embodiment, the pulse generation part 3 outputs the OFF pulse signals poff1, poff2 and poff3. Accordingly, even if the OFF pulse signals poff1 and poff2 are output during the period twd2 that is prolonged than imagined and hence the control part 4 fails to output an OFF signal, the OFF pulse signal poff3 allows the control part 4 to output an OFF signal reliably based on the trailing edge of the signal HIN in the fourth preferred embodiment. The result is that the switching device 40 can be brought into a non-conducting state reliably based on the trailing edge of the signal HIN, thereby performing even more reliable control.

Also in the fourth preferred embodiment, when causing the switching device 40 to transition from the OFF state to the ON state, the pulse generation part 3 outputs the ON pulse signal pon2 after a lapse of the time ptd2 after outputting the ON pulse signal pon1, and the time ptd2 is set greater than the period twd1 during which the signals ONR and OFFR are fixed at a low level due to the drop in the potential VS to become less than the certain negative potential. Therefore, even if the control part 4 does not output an ON signal during the period twd1, the control part 4 can output an ON signal reliably based on the leading edge of the signal HIN. The result is that the switching device 40 can be brought into a conducting state reliably based on the leading edge of the signal HIN.

Alternatively, the part of the pulse generation part 3 from which the ON transmission pulse signal is output may be configured as that in the second or the third preferred embodiment.

Fifth Preferred Embodiment

In order to prevent arm short circuits where the high-potential side switching device 40 and the low-potential side switching device 42 are simultaneously brought into a conducting state, time (dead time) for simultaneously bringing both into a non-conducting state is usually provided. Accordingly, in the event that the switching device 40 cannot be brought into a non-conducting state within the prescribed dead time period, an arm short circuit occurs where the switching devices 40 and 42 are both brought into a conducting state.

For this reason, in the semiconductor device 60 according to the fourth preferred embodiment, the time interval between the respective outputs of the OFF pulse signals poff1 and poff3 is set smaller than the dead time.

Setting such way, even when the switching device 40 cannot be brought into a non-conducting state by the OFF pulse signals poff1 and poff2, for example, the OFF pulse signal poff3 allows the switching device 40 to be brought into a non-conducting state reliably within the dead time period. Accordingly, it is possible to prevent arm short circuits where the switching devices 40 and 42 are simultaneously brought into a conducting state.

There are no limitations on the time interval between the respective outputs of the OFF pulse signals poff1 and poff2 or the time interval between the respective outputs of the OFF pulse signals poff2 and poff3 as long as they are within the dead time period.

While the invention has been shown and described in detail, the foregoing description is in all aspects illustrative and not restrictive. It is therefore understood that numerous modifications and variations can be devised without departing from the scope of the invention.

What is claimed is:

1. A driving circuit for a switching device, comprising:
   a pulse generation part outputting an ON transmission pulse signal based on one edge of an input signal of said driving circuit, and outputting an OFF transmission pulse signal based on the other edge of said input signal; and
   a control part outputting an ON signal for bringing said switching device into a conducting state based on said ON transmission pulse signal, and outputting an OFF signal for bringing said switching device into a non-conducting state based on said OFF transmission pulse signal, wherein
   said ON transmission pulse signal includes first and second ON pulse signals, and
   said pulse generation part outputs said first ON pulse signal based on said one edge, and outputs said second ON pulse signal based on said one edge on which the output of said first ON pulse signal is based after a lapse of prescribed time after outputting said first ON pulse signal.

2. The driving circuit according to claim 1, wherein
   said ON transmission pulse signal further includes a third ON pulse signal, and
   said pulse generation part outputs said third ON pulse signal based on said one edge on which the output of said first ON pulse signal is based after a lapse of prescribed time after outputting said second ON pulse signal.

3. The driving circuit according to claim 1, wherein
   said OFF transmission pulse signal includes first and second OFF pulse signals, and
   said pulse generation part outputs said first OFF pulse signal based on said other edge, and outputs said second OFF pulse signal based on said other edge on which the output of said first OFF pulse signal is based after a lapse of prescribed time after outputting said first OFF pulse signal.

4. The driving circuit according to claim 3, wherein
   said OFF transmission pulse signal further includes a third OFF pulse signal, and
   said pulse generation part outputs said third OFF pulse signal based on said other edge on which the output of said first OFF pulse signal is based after a lapse of prescribed time after outputting said second OFF pulse signal.

5. The driving circuit according to claim 4, wherein said OFF transmission pulse signal is output within a prescribed dead time period.

6. A semiconductor device comprising:
   a switching device; and
   a driving circuit for said switching device, comprising:
      a pulse generation part outputting an ON transmission pulse signal based on one edge of an input signal of said driving circuit, and outputting an OFF transmission pulse signal based on the other edge of said input signal; and
      a control part outputting an ON signal for bringing said switching device into a conducting state based on said ON transmission pulse signal, and outputting an OFF signal for bringing said switching device into a non-conducting state based on said OFF transmission pulse signal, wherein
      said ON transmission pulse signal includes first and second ON pulse signals, and
      said pulse generation part outputs said first ON pulse signal based on said one edge, and outputs said second ON pulse signal based on said one edge on which the output of said first ON pulse signal is based after a lapse of prescribed time after outputting said first ON pulse signal.

7. A driving circuit for a switching device, comprising:
   a pulse generation part outputting an ON transmission pulse signal based on one edge of an input signal of said driving circuit, and outputting an OFF transmission pulse signal based on the other edge of said input signal; and
   a control part outputting an ON signal for bringing said switching device into a conducting state based on said ON transmission pulse signal, and outputting an OFF signal for bringing said switching device into a non-conducting state based on said OFF transmission pulse signal, wherein
   said ON transmission pulse signal includes an ON pulse signal having a prescribed pulse length,
   said control part receives the output potential of said switching device as a reference potential, and
   said prescribed pulse length is set greater than a period during which said reference potential drops to a level which prevents said control part from performing a normal operation at switching time of said switching device.

8. The driving circuit according to claim 7, wherein
   said OFF transmission pulse signal includes first and second OFF pulse signals, and
   said pulse generation part outputs said first OFF pulse signal based on said other edge, and outputs said second OFF pulse signal based on said other edge on which the output of said first OFF pulse signal is based after a lapse of prescribed time after outputting said first OFF pulse signal.

9. The driving circuit according to claim 8, wherein said OFF transmission pulse signal further includes a third OFF pulse signal, and
said pulse generation part outputs said third OFF pulse signal based on said other edge on which the output of said first OFF pulse signal is based after a lapse of prescribed time after outputting said second OFF pulse signal.

10. The driving circuit according to claim 9, wherein said OFF transmission pulse signal is output within a prescribed dead time period.

11. A semiconductor device comprising:
a switching device; and
a driving circuit for said switching device, comprising:
    a pulse generation part outputting an ON transmission pulse signal based on one edge of an input signal of said driving circuit, and outputting an OFF transmission pulse signal based on the other edge of said input signal; and
    a control part outputting an ON signal for bringing said switching device into a conducting state based on said ON transmission pulse signal, and outputting an OFF signal for bringing said switching device into a non-conducting state based on said OFF transmission pulse signal, wherein
    said ON transmission pulse signal includes an ON pulse signal having a prescribed pulse length,
    said control part receives the output potential of said switching device as a reference potential, and
    said prescribed pulse length is set greater than a period during which said reference potential drops to a level which prevents said control part from performing a normal operation at switching time of said switching device.

12. A driving circuit for a switching device, comprising:
a pulse generation part outputting an ON transmission pulse signal based on one edge of an input signal of said driving circuit, and outputting an OFF transmission pulse signal based on the other edge of said input signal; and
a control part outputting an ON signal for bringing said switching device into a conducting state based on said ON transmission pulse signal, and outputting an OFF signal for bringing said switching device into a non-conducting state based on said OFF transmission pulse signal, wherein
said OFF transmission pulse signal includes first to third OFF pulse signals, and
said pulse generation part outputs said first OFF pulse signal based on said other edge, outputs said second OFF pulse signal based on said other edge on which the output of said first OFF pulse signal is based after a lapse of prescribed time after outputting said first OFF pulse signal, and outputs said third OFF pulse signal based on said other edge on which the output of said first OFF pulse signal is based after a lapse of prescribed time after outputting said second OFF pulse signal.

13. The driving circuit according to claim 12, wherein said OFF transmission pulse signal is output within a prescribed dead time period.

14. A semiconductor device comprising:
a switching device; and
a driving circuit for said switching device, comprising:
    a pulse generation part outputting an ON transmission pulse signal based on one edge of an input signal of said driving circuit, and outputting an OFF transmission pulse signal based on the other edge of said input signal; and
    a control part outputting an ON signal for bringing said switching device into a conducting state based on said ON transmission pulse signal, and outputting an OFF signal for bringing said switching device into a non-conducting state based on said OFF transmission pulse signal, wherein
    said OFF transmission pulse signal includes first to third OFF pulse signals, and
    said pulse generation part outputs said first OFF pulse signal based on said other edge, outputs said second OFF pulse signal based on said other edge on which the output of said first OFF pulse signal is based after a lapse of prescribed time after outputting said first OFF pulse signal, and outputs said third OFF pulse signal based on said other edge on which the output of said first OFF pulse signal is based after a lapse of prescribed time after outputting said second OFF pulse signal.

* * * * *